(12) United States Patent
Coleman

(10) Patent No.: US 6,215,294 B1
(45) Date of Patent: Apr. 10, 2001

(54) STORM WARNING METHOD AND APPARATUS

(76) Inventor: Ernest Wilson Coleman, 515 W. Kelton La., Phoenix, AZ (US) 85023

( * ) Notice: Subject to any disclaimer, the term of this patent is extended or adjusted under 35 U.S.C. 154(b) by 0 days.

(21) Appl. No.: 09/223,532

(22) Filed: Dec. 30, 1998

(51) Int. Cl.$^7$ .................................................. G01R 29/08
(52) U.S. Cl. ........................................ 324/72; 324/76.19
(58) Field of Search ................................... 324/72, 76.19

(56) References Cited

U.S. PATENT DOCUMENTS

| | | | |
|---|---|---|---|
| 4,422,037 | 12/1983 | Coleman | 324/72 |
| 4,639,666 | 1/1987 | Strosser | 324/202 |
| 4,672,305 | 6/1987 | Coleman | 324/72 |
| 4,684,951 | 8/1987 | Baumer | 342/460 |
| 4,801,942 | 1/1989 | Markson | 342/460 |
| 4,803,421 | 2/1989 | Ostrander | 324/72 |
| 4,873,483 | 10/1989 | Ostiander | 324/72 |
| 4,972,195 | 11/1990 | Markson | 342/460 |
| 5,057,820 | 10/1991 | Markson | 340/600 |
| 5,168,212 | 12/1992 | Byerley | 324/72 |
| 5,245,274 | 9/1993 | Youngquist | 324/72 |
| 5,263,368 | 11/1993 | Breitmeier | 73/170 |
| 5,295,071 | 3/1994 | Kuzma | 324/420 |
| 5,295,072 | 3/1994 | Stevens | 364/420 |
| 5,303,152 | 4/1994 | Moses | 364/420 |
| 5,396,220 | 3/1995 | Markson | 340/600 |
| 5,408,175 | 4/1995 | Youngquist | 324/72 |
| 5,500,586 | 3/1996 | Youngquist | 324/72 |
| 5,500,602 | 3/1996 | Youngquist | 324/72 |
| 5,502,371 | 3/1996 | Youngquist | 324/72 |
| 5,504,421 | 4/1996 | Youngquist | 324/72 |
| 5,528,494 | 6/1996 | Moses | 364/420 |
| 5,537,318 | 7/1996 | Moses | 364/420 |
| 5,541,501 * | 7/1996 | Shaver et al. | 324/72 |
| 5,610,813 | 3/1997 | Greenewald | 364/420 |
| 5,699,245 | 12/1997 | Herold | 364/420 |

* cited by examiner

*Primary Examiner*—Safet Metjahic
*Assistant Examiner*—Vincent Q. Nguyen

(57) ABSTRACT

An apparatus and method of detecting, tracking and displaying lightning activity is disclosed. A lightning stroke has associated therewith electric and magnetic field components characterized by maximum rise times and minimum power levels. The field signals comprise a plurality of sub pulses also. An electric field antenna and a pair of magnetic field antennas are disposed to receive the field components associated with lightning activity. Control circuitry cooperating with rise time and threshold measuring which operates on the field signals received by antennas generates control signals including integration and sampling control signals over a predetermined time interval (preferable one point four seconds) and for sampling and holding the field signals at each of the sub pulse peak. Preprocessing circuitry upon command from a programmable microprocessor A to D converts the sampled field components where they are stored as digital data in memories. In response to control signals from the control circuitry the microprocessor determines the azimuth angles to the lightning activity based on the sampled field data and determines the range based on both the inverse of the magnetic field and the pulse width of the electric field components. The sampled field data is grouped and assigned levels of intensity. The angle, range and intensity information is transmitted to a display processor and display where it can be displayed in a variety of formats. Where the apparatus is mounted in an aircraft, the speed of the aircraft and changes in heading are factors into the determination and display of the angles and range.

6 Claims, 16 Drawing Sheets

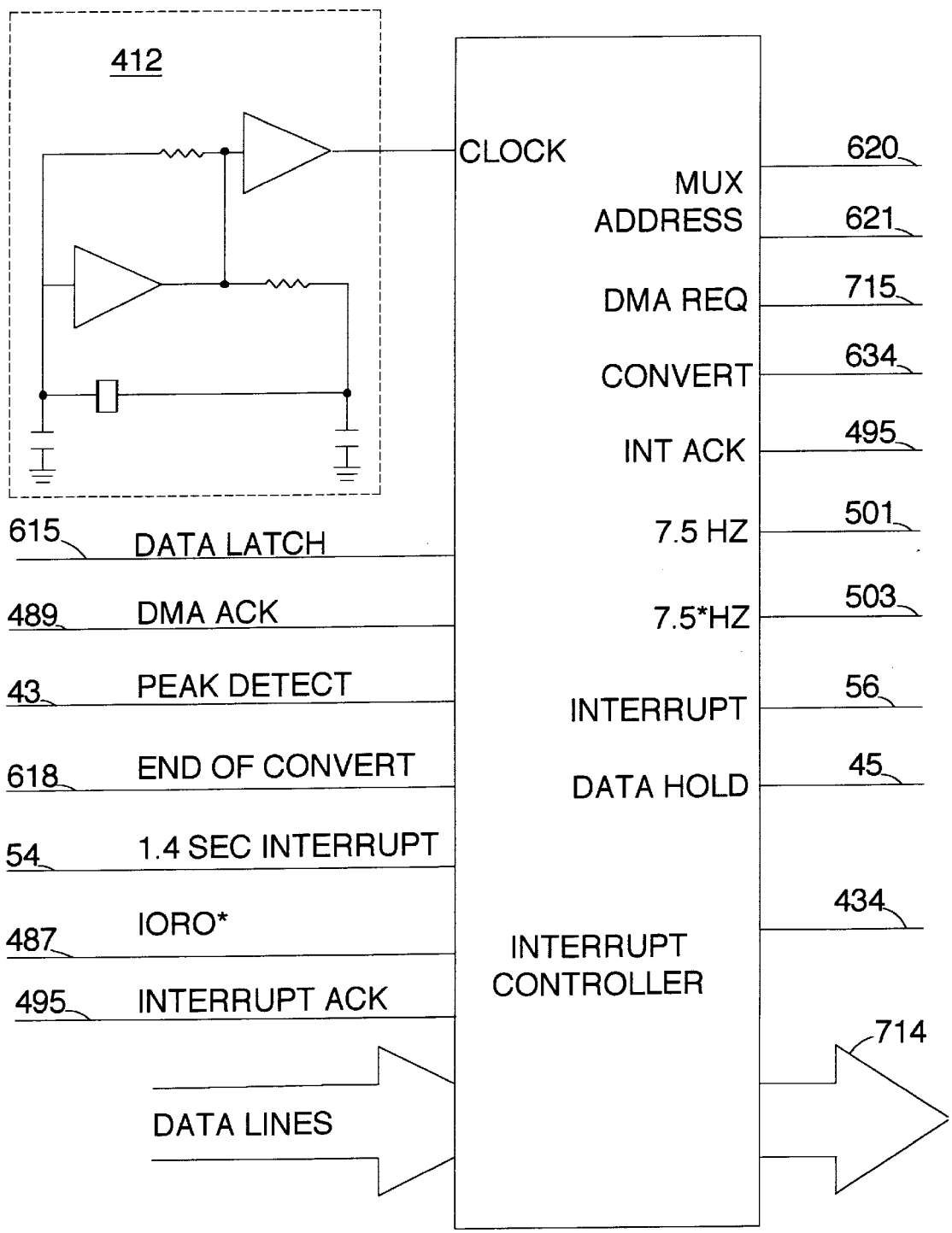

STORM WARNING METHOD AND APPARATUS

BACKGROUND OF THE INVENTION

1. Field of Invention

This invention relates to an apparatus and method for displaying the lightning rate of activity and location from the observers.

2. Description of Prior Art

Thunder storms create great dangers particularly to air travel due to the turbulence and electrical activity (lightning). Pilots of aircraft need to track, predicted and avoided thunder storms. The electrical signals generated by thunderstorms vary greatly during the life of the thunderstorm. During the early stages of building thunderstorms, the number of electrical signals will increase. This is the stage of high turbulence. The number of electrical signals generated during the mature stage is also very high as is the ending stage of a thunderstorm. Weak storm fronts with little turbulence generate electrical signals but with very less frequent rate. The detection, recognition, accurate measurement and analysis of these electrical signals provide a basis for storm tracking, avoidance, etc.

Lightning flashes are composed of a series of high current lightning strokes, each stroke being proceeded by a lower current discharge called a leader. The duration of electrical activity associated with a lightning stroke varies but in many instances last as much as a hundred microseconds. The initial rise time of electrical signals associated with a lightning stroke almost never exceeds five microseconds. Following the first peak of the electrical signals of a lightning stroke, lesser signals of sub-microsecond duration but with fast rise times (of five microseconds or less) will occur. Several lightning detection systems have been created-for example, in U.S. Pat. No. 4,422,037 (1983), U.S. Pat. No. 4,672,305 (1987) both to Coleman, U.S. Pat. No. 4,639,666 (1987) to Strosser et al., U.S. Pat. No. 4,684,951 (1987) to Baumer, U.S. Pat. No. 4,803,421 (1989) and U.S. Pat. No. 4,873,483 (1989) both to Ostrander, U.S. Pat. No. 4,831,362 (1989) to Tsaprazis, U.S. Pat. No. 4,801,942 (1989), U.S. Pat. No. 4,972,195 (1990), and U.S. Pat. No. 5,057,820 (1991) all to Markson et al., U.S. Pat. No. 5,168,212 (1992) to Byerley, III et al., U.S. Pat. No. 5,263,368 (1993) to Breitmeier et al., U.S. Pat. No. 5,295,071 (1994) to Kuzma et al., U.S. Pat. No. 5,303,152 (1994) to Moses et al, U.S. Pat. No. 5,295,072 (1994) to Stevens, Jr. et al, U.S. Pat. Nos. 5,245,274, 5,408,175 (1995), U.S. Pat. No. 5,500,602 (1996), U.S. Pat. No. 5,502,371 (1996), U.S. Pat. No. 5,504,421 (1996), and U.S. Pat. No. 5,500,586 (1996) all to Youngqvist, U.S. Pat. No. 5,396,220 (1995) to Markson et al, U.S. Pat. No. 5,528,494 (1996) and U.S. Pat. No. 5,537,318 (1996) both to Moses, U.S. Pat. No. 5,441,501 (1996) to Shaver et al, U.S. Pat. No. 5,610,813 (1997) to Greenwald, U.S. Pat. No. 5,699,245 (1997) to Herold. These lightning detection apparatus determine range and bearing to storms using the frequency components emanating from lightning. These apparatuses suffer from a number of disadvantages:

1. The installation of these systems in aircraft requires locating the system away from low frequency (noises area) generators such as deicing equipment and 400 hertz power supply connections.
2. Calibrating these systems to minimize aircraft effects and noise sources.
3. The displaying of the rate of lightning activity over a predetermined time interval is not provided.

Consumers installing the apparatus on aircraft have problems finding a location on the aircraft with low aircraft noise at the lightning frequency chosen by the apparatus. There are a limited number of locations available to the consumer to install lightning hardware antennas. The ability to move the antenna to minimize aircraft noise is costly and most cases prohibited, For example, in the U.S. Pat. No. 3,715,660, (Ruhnke) based on the ratio of signals representing the magnetic and electric field associated with the discharge. The determination of the direction of the discharge is not made. In addition, U.S. Pat. No. 4,422,037 (Coleman) and companion patent (U.S. Pat. No. 4,672,305) discloses a storm mapping system which determines range based on the ratio of electromagnetic fields measured at two set frequencies and comparing the obtained values to strikes occurring in three ranges near field, mid field and far field. These apparatuses range accuracy increased by decreasing the measured lightning frequency. Unfortunately, the aircraft power systems also work at lower frequencies. The apparatus ability to detect lightning at ranges to 100 miles was compromised. The consumer objected to this reduced range setting. Further, an apparatus (U.S. Pat. No. 4,873,483 and companion U.S. Pat. No. 4,803,421 (Ostrander)) determines the range to the lightning strike based on the ratio of integrated electromagnetic signals. The electromagnetic fields are associated to signals received by a narrow band and a wide band filter. Each pulse is further classified by the pulse width of the lightning discharge to isolates the far field, mid field and near field signals. As with the prior inventions, this apparatus measured the lightning over a wide frequency range. Thus the same potential for detecting aircraft noise caused false targets to be displayed. No display of lightning rate is provided.

Inventors have created apparatuses to detect the aircraft noise and minimize displaying false targets. For example, the U.S. Pat. No. 5,295,072 (Stevens) and U.S. Pat. No. 5,303,152 incorporates a number of the features included in the previously discussed patents. As set forth, the range and bearing is determined by taking many samples of the lightning signals over a period of time to determine the frequency signature. A group of filters are used to determine the frequency signature. Range and bearing is determined by applying a set of weights to each filter output. Further, the pulse width is used to classify the lightning strikes into three types to set the weight values. Although these apparatuses incorporated software algorithms to eliminate aircraft noise and false targets, the consumers still complain of false targets and confusion on the lightning storm location. No display of lightning rate is provided.

U.S. Pat. No. 5,500,586 (Youngquist), and companion U.S. Pat. Nos. 5,504,421 and 5,500,602 (Youngquist) incorporate a number of the previously discussed features. The storm monitoring apparatus orients the magnetic fields at an angle of 45 degrees to the heading axis of an aircraft and determines to range and bearing by evaluating at a high rate the frequency or spectrum of the lightning signal. This apparatus does not address the noise aircraft installation problem.

U.S. Pat. No. 4,023,408 discloses a storm mapping system that detects electrical activity caused by weather phenomenon such as lightning strokes. The system is intended to operate on the far field (or radiation field) pattern generated by the lightning stroke. According to the disclosed, the far field pattern is characterized mainly by a low frequency spectrum with maximum amplitude signals occurring between seven and seventy three kilohertz (kHz). A trio of antenna sensors, an electric field antenna and two-crossed magnetic field antennas, are used and each is connected to a tuned receiver on a center frequency of fifty kHz. The crossed loop magnetic field antennas are used to locate the lightning signals in azimuth angle by comparing the relative magnitude of the signals induced in the cross loop sensors to the electric field antenna in a conventional manner. The magnetic field signals are time correlated with the electric field signals before integration. This provides some measure of avoiding unwanted noise like signals. Integration of the correlated signals is formed for 0.5 milliseconds but only after the vector sum of the magnetic field sensor signals is found to exceed a predetermined threshold value. The algebraic sum of the magnetic field sensor signals is amplified and then squared. This signal is used to divide the integrator output signals thereby reducing the magnitude of larger correlated integrated signals below the magnitude of smaller ones. These inverted signals then drive a display such as a CRT display to show larger signals closer to the observation point and smaller signals farther away.

This system has been used on aircraft and appears to work well, but it depends heavily on the magnitude of correlated electric and magnetic field signals to provide a measure of the range of the signal from the observation point of the equipment. Accordingly, the accuracy of range estimates may be affected by the variation in the severity of the thunderstorms. Also, some of the detailed characteristics of lightning stroke signals are not utilized to discriminate between interfering signals and true lightning electrical signals. The rate of lightning activity over a predetermined time is not provided.

Lightning Phenomenon Overview

The average lightning strike's duration is from 0.5 second up to 1 second. A lightning strike is made up of the following measurable components:
1. Preliminary Discharge
2. Dart Leaders
3. Stroke(s)

The Preliminary Discharge will last for typically 5 to 6 milliseconds. Then Dart Leaders will occur for 4 milliseconds, typically, until contacting the ground/etc. Dart Leaders last 100 microseconds each for 3 milliseconds and then 10 microseconds each for 1 millisecond for approximately 50 dart leaders total. Typically, 30 microseconds occur between the occurrence of the last Dart Leader and the Stroke. Ninety percent of the lightning strikes contain less than 8 strokes.

The average lightning strike contains 3 to 4 strokes. Each stroke has a maximum duration of 1 millisecond. Typically, there are 40 to 80 milliseconds between strokes. The signal signature between a Preliminary Discharge, Dart Leaders, and Strokes are very distinct. For further detailed information, see "Airborne Warning Systems for Natural and Aircraft-initiated Lightning", RTCA paper No. 306-82/AHTD-4 dated Nov. 8, 1982.

The objects and advantages of the present invention are:
1. A lightning detection system whose installation is convenient and not susceptible to aircraft low frequency noise;
2. A lightning detection system with increase range detection;
3. A lightning detection system with increase sensitivity to displaying the rate of lightning.

The objects, features and advantages of the present invention will become more fully apparent from the following detailed description of the preferred embodiment, the appended claims and the accompanying drawings in which:

FIG. 1 comprises a functional block diagram of the preferred embodiment of the storm detection apparatus of the present invention.

FIG. 2 detail schematic diagram of the preferred embodiment of the antenna of the present invention FIGS. 3 and 3A are functional block diagrams of the preferred embodiment of the analog converter of the apparatus of the present invention.

SUMMARY OF THE INVENTION

Figure 1:
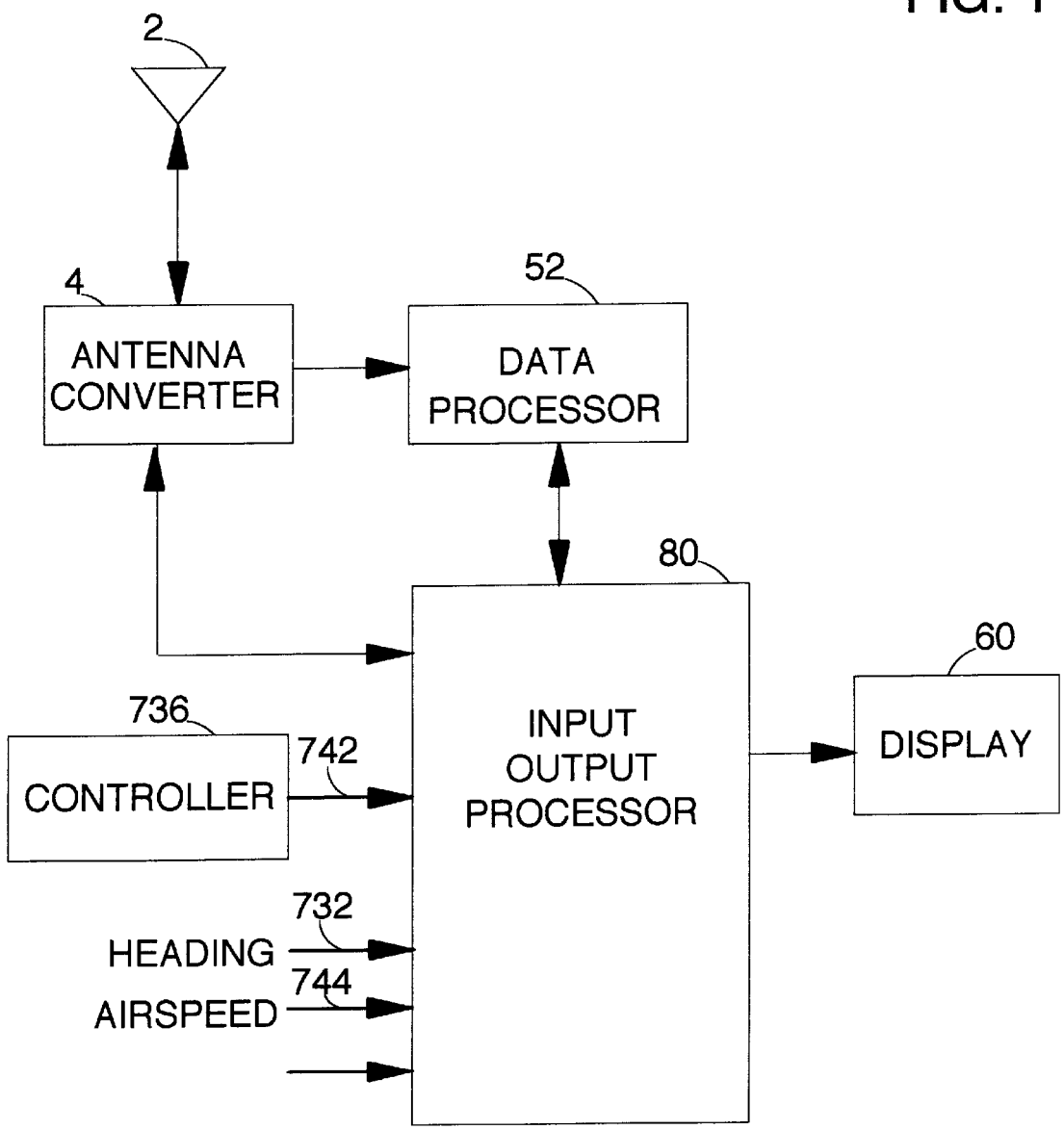

The present invention comprises an apparatus and method for displaying the location of regions of recently occurring lightning activity. The invention comprises a receiving means for separately receiving the electric (E), the wing magnetic (Hwing) and the nose magnetic (Hnose) field components of lightning signals over a range of frequencies outside the low aircraft noise frequencies. In the preferred embodiment, the receiving means includes a pair or cross-loop sensors and an electric field sensor. These sensors measure the time rate of change of the magnetic and electric flux densities. The outputs are suitably amplified and integrated to provide a measure of the E and H fields of the lightning signals.

Recognition circuitry means connected to the receiving means recognizes lightning signals received by the receiving means and discriminates against interfering signals and background noise. The recognition circuitry means, in the preferred embodiment, comprises rise time circuitry means and threshold circuitry means which response to the rise time of the electric field signals and amplitude of the magnetic field components respectively. Alternatively, the rise time of the magnetic field components can be utilized. When a positive rise time signal and positive threshold signal is present at the same time, first gating circuitry is triggered which provides a signal indicating that a bonafide lightning strike has occurred. Control circuitry means connected to the recognition circuitry means provides control signals to the apparatus. It provides integration control signals, sampling control signals, and an interrupt signal.

The output of the receiving means is also transmitted to a sampling means which is response to sampling control signals from the control circuitry means samples the E and H field values of the receiving means. These samples are provided each times the electric field value peaks. The control circuitry means measures the rise time to peak of the E field. These signals are held at the peak value by track and hold circuitry and then converted by A to D converters and stored in a memory. When the predetermined time interval is over, that is, when the lightning stroke activity ends, an interrupt signals from the control circuitry means is transmitted to a programmable processing means which in turn reads the contents of the memory. The sampled E and H field values read from the memory are used to compute the range to the lightning by the following equation:

Range=13250/[1.5*HMP+0.5*RISETIME*RISETIME]

HMP=square root(Hwing)2+(Hnose)2)

Angle=arctan(Hwing/Hnose)

Where angle is the azimuth angle to the lightning stroke relative to the nose of the aircraft.

The total magnetic field value (HMP) is calculated from the sampled magnetic fields. The location of each lightning stroke is group into cells and a level of activity is transmitted to a programmable display means. The display means then displays the cell as a region of activity on a display, in accordance with its own programming. The display symbol shows location relative to aircraft position and rate of lightning strokes over a predetermined time of four minutes in the preferred design. When the apparatus of the present invention is installed in an aircraft, means for adjusting and updating the measurement of lightning stroke location for aircraft movement (speed and heading) is provided.

DETAILED DESCRIPTION OF THE PREFERRED EMBODIMENT

Figure 2:
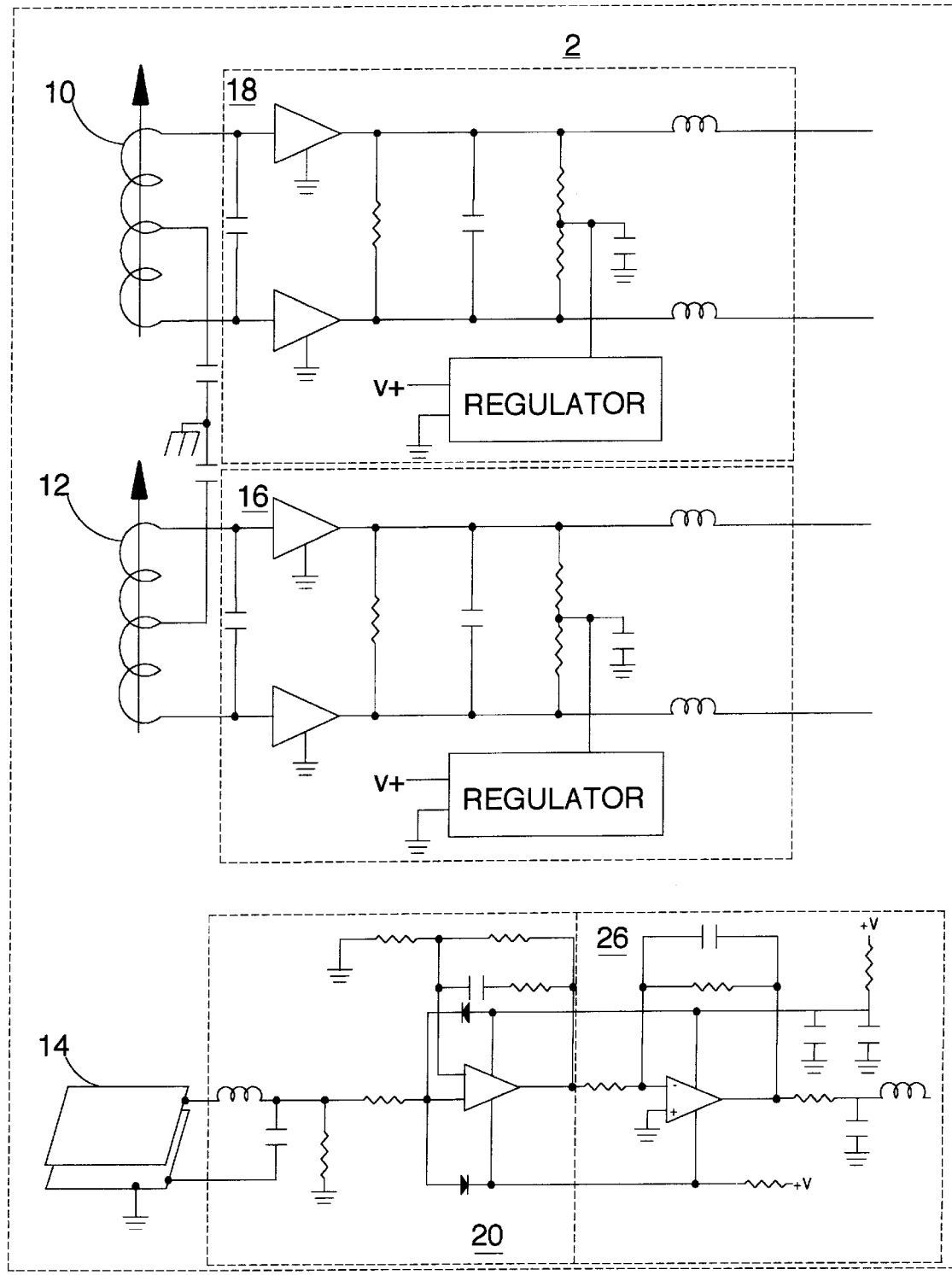

Description of FIGS. 1 and 2

Referring now to FIG. 1 there is shown a block diagram of a preferred embodiment of the storm warning system of the present invention generally designated 5. As shown in FIG. 1, the system 5 comprises an antenna 2, analog converter 4, a data processor 52, an I/O processor 80, a controller 736 and a display 60. Aircraft position data is provided to I/O processor 80 via lines 742 and 732 as heading and 744 airspeed respectively. Referring to FIG. 2, the antenna 2 is comprised of a pair of cross loop magnetic field antennas 10 and 12 and an electric field antenna 14. Since the cross loop magnetic field antenna elements have their axes perpendicular to one another, antenna 10 will be referred to as the nose magnetic field (Hnose) antenna while antenna 12 will be referred to as the wing magnetic field antenna (Hwing). The three antenna elements are responsive to the time rate of change of magnetic and electric flux densities occurring as a result of electrical activity associated with lightning strikes. The signals received by the antenna elements are transmitted to wide band amplifiers, designated generally 16, 18 and 20. In the preferred embodiment, the antenna elements 10, 12, 14 and the wide band amplifiers (16, 18 and 20) operate over a frequency range of from approximately 10-kilohertz to approximately 3-megahertz. Amplifiers 16 and 18 are in the preferred embodiment manufactured by Motorola type MWA 110. The electric field antenna amplifier 20 is manufactured by Fairchild type OP37. The electric field integrator 26 is included within the antenna 5 assembly and is of the type 2510.

Figure 3:
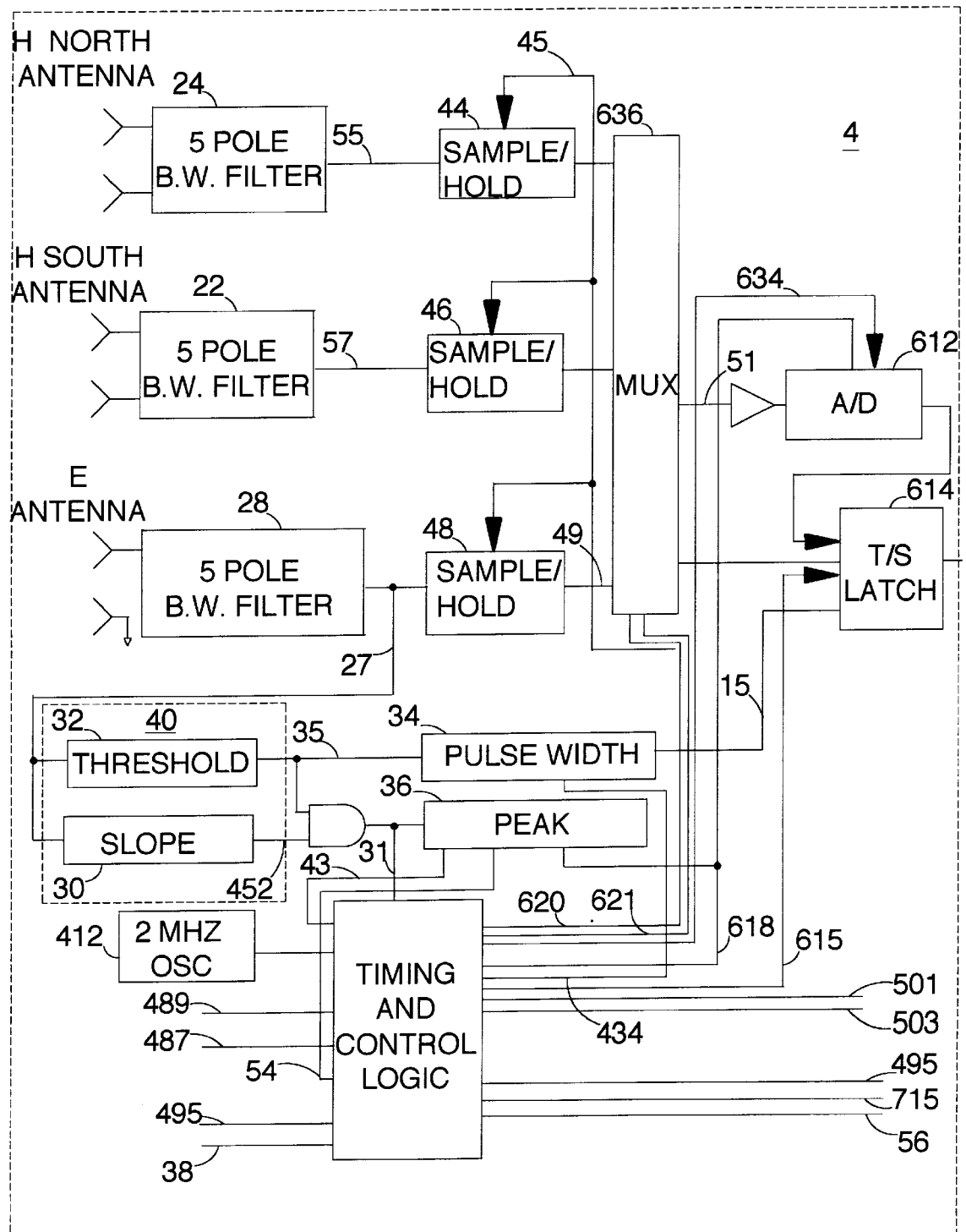

Description of FIGS. 3 to 3A

Referring to FIG. 3, analog converter 4 is shown. Outputs of amplifiers 16 and 18 which provide wing magnetic field component and a nose magnetic field component are provided to a five pole filter with a 3 DB bandwidth of 760 kilohertz designated as 22 and 24 respectively. The vertical electric field component integrator 26 is also filter by a five pole filter with a 3 DB bandwidth of 760 kilohertz designated 28. The output of the five pole filters 22, 24 and 28 are provided in parallel to a sampling portion of the circuitry (46, 44 and 48) and to a recognition circuitry portion 40 of the apparatus of the present invention. The recognition circuitry portion comprises slope detection circuitry designated generally 30 and threshold detection circuitry designated generally 32. The output of the five pole filter 28 referring again to FIG. 3, containing the vertical electric field signal, is transmitted to slope detection circuitry 30 via line 27. If the rise time of this signal is less than a predetermined rise time, a positive signal is transmitted to timer circuitry, generally designated 36, via line 31. Similarly, the electric field signal transmitted from five-pole filter 28 represents the magnitude of the total vertical electric field present at the antenna element 14. This signal is transmitted via line 27 to threshold detection circuitry 32 which provides a positive signal to pulse width monitor circuitry 34 via line 35 (see FIG. 3) if the signal exceeds a predetermined threshold level. If the voltage level of the electric field signal from the filter 28 exceeds the predetermined threshold level of threshold detector 32 and if the rise time of the vertical electric field signal from filter 28 is less than the predetermined rise time of the slope detector 30, then the peak detector 36 is caused to provide a control signal output via line 43 to interrupt controller 38. Interrupt controller 38 is programmable array logic manufactured by RCA part number S100192. Interrupt controller 38 is programmed in accordance to timing diagram shown in FIG. 5A.

The nose and wing magnetic field signals are also transmitted over lines 55 and 57 to high frequency sample/hold circuits 44 and 46 respectively. The vertical electric field signal from filter 28 is transmitted via line 27 to high frequency sample/hold circuit 48. Samples of the high frequency magnetic and electric field signals representing the peak of each change in the fields are taken in response to peak detection signals from peak detector 36 over line 43 (FIG. 3A). Peak detector 36 (in response to positive output signals from the slope detector 30) generates peak detection signals. The pulse width monitor 34, in response to positive output signals from the threshold detector 32, measures the threshold to peak time of each sample amplitude by monitoring the output of threshold detector 32 on line 35. The pulse width monitor 34 provides threshold to peak time measurement signals over 4 multiple lines to latch 614 via line 15. The high frequency samples of the magnetic and electric field signals, which are output from high frequency sample and hold circuits 44, 46 and 48 on lines 45, 47 and 49 respectively, are converted to digital signals by analog to digital (A/D) converter 612 in response to the convert signal 634 from interrupt controller 38. Interrupt controller provides signal 634 in response to peak detection signals via line 43. Sample and hold circuit 48 signal output from the electric field (line 49) passes through a multiplexer 636, A/D converter 612 via line 51 converts the output of which. When the A/D converter 612 completes the conversion a control signal transmits a high signal to interrupt controller 38 and peak detector 36 via line 618. Interrupt controller 38 provides control signals to multiplexer 636 to switch the input to the wing magnetic sample/hold 46. Latch 614 provides A/D output lines in response to control signal 615 and the peak pulse width lines 15 to data bus 714 (FIG. 3A). Using DMA request via line 715 to microprocessor 707 (FIG. 3A), the nose magnetic, wing magnetic, the Electric Peak signal and pulse width is stored in RAM 708. The data processor 52 provides DMA acknowledge via line 489 to interrupt controller 38. In response to this control signal the interrupt controller provides convert signal via line 634 to A/D converter 612 which converts the wing sample hold signal. Same sequence as above, the control signal 618 causes interrupt controller 38 to DMA the data to RAM 708 using microprocessor 707 DMA channel 0. The interrupt controller 38 provides control signals via line 621 to multiplexer 636 to switch nose magnetic signal to the A/D controller 612 input. In response to the DMA acknowledge signal 489 the controller 38 provides convert command signal 634 to A/D converter 612. As in the previous two responses to control signal 618, the controller causes the nose magnetic peak signal to be stored in RAM 708 via DMA control signal 715. After converting the peak nose, wing, and electric signals along with the rise time of the peak electric signal, the controller will reset the peak detector 36 and pulse width monitor 34 via line 495. The interrupt controller 38 will provide the control signals as discussed above to cause the electric signal, wing signal, nose signal and peak rise time to be stored in RAM 708. The interrupt controller 38 will continue storing data into RAM 708 until one shot 462 (FIG. 6A) provides control signal 54 (1.4 seconds for preferred embodiment).

Figure 4:
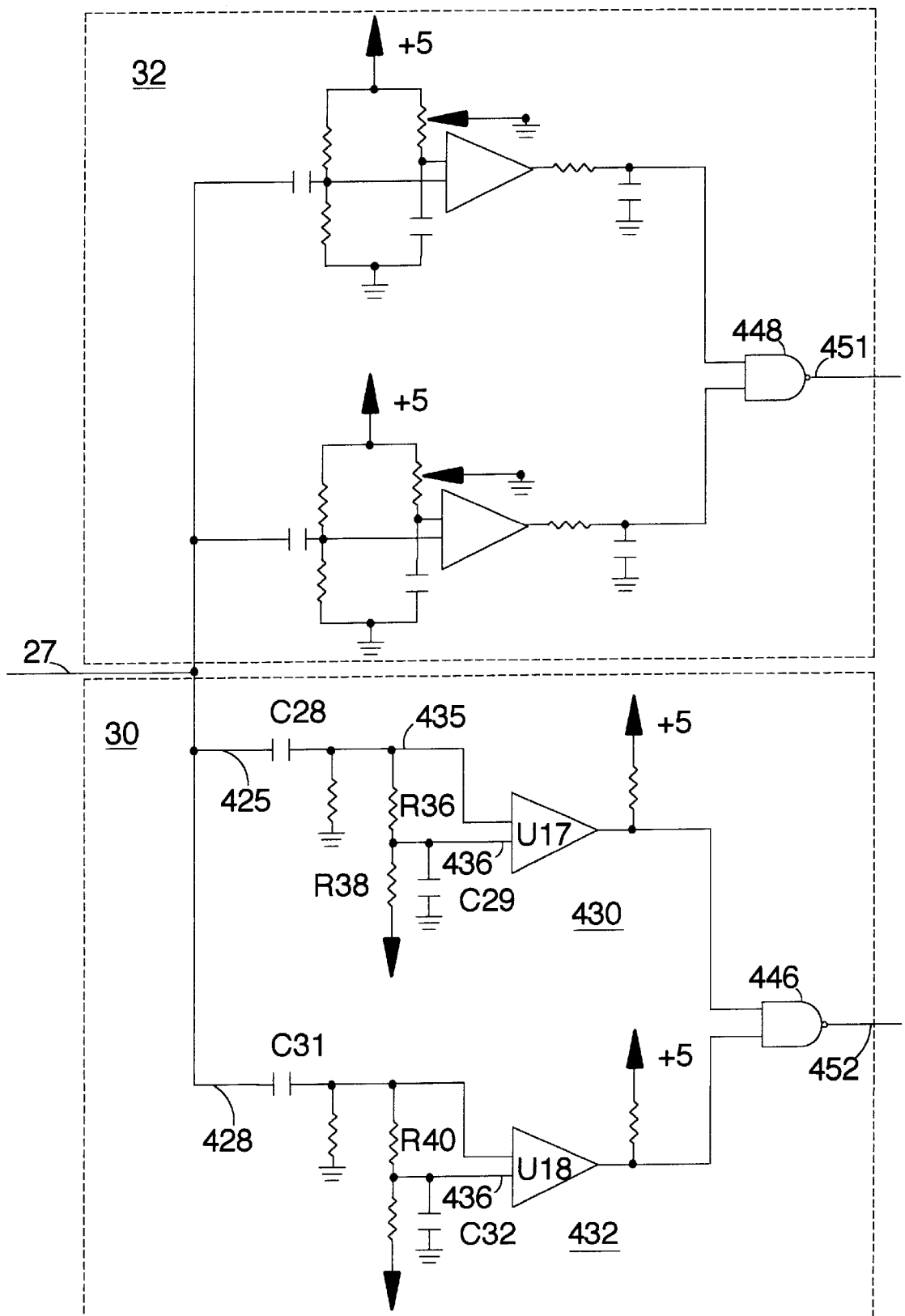
FIG. 4 is a schematic diagram of the recognition circuitry of the apparatus of the present invention.
Figure 5:
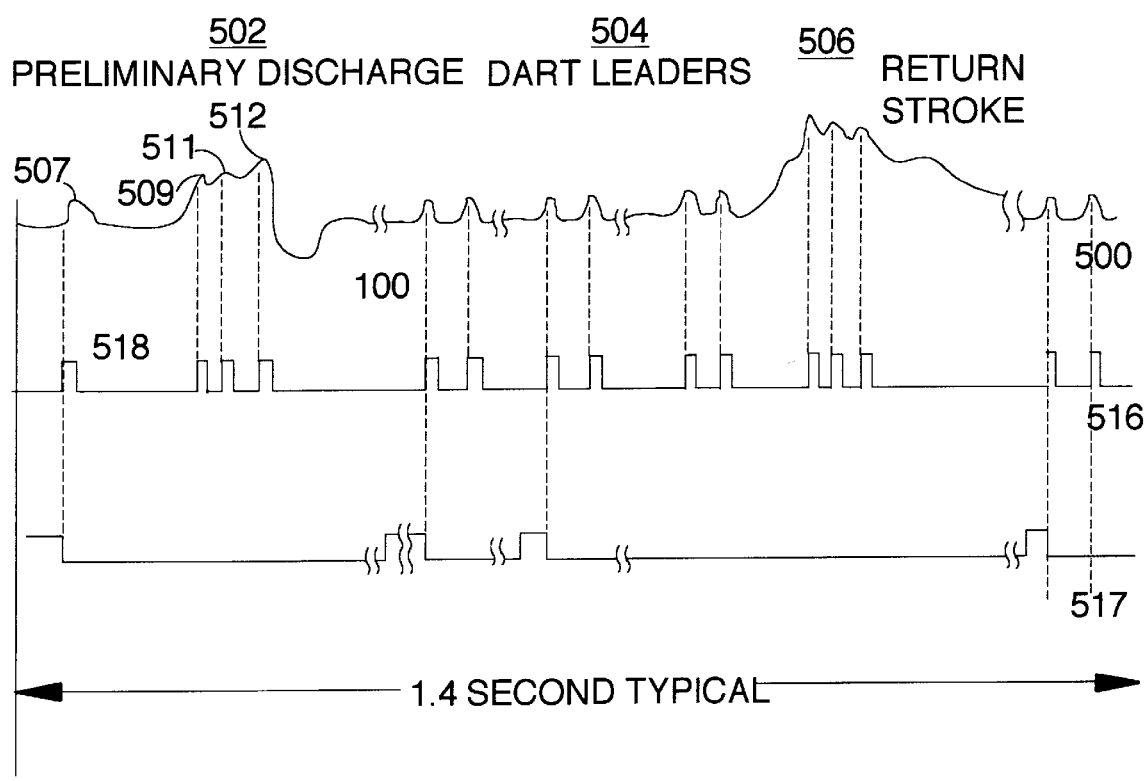
FIGS. 5 and 5A depicts the signals of a lightning stroke in relation to a timing diagram for the apparatus of the present invention.
Figure 5A:
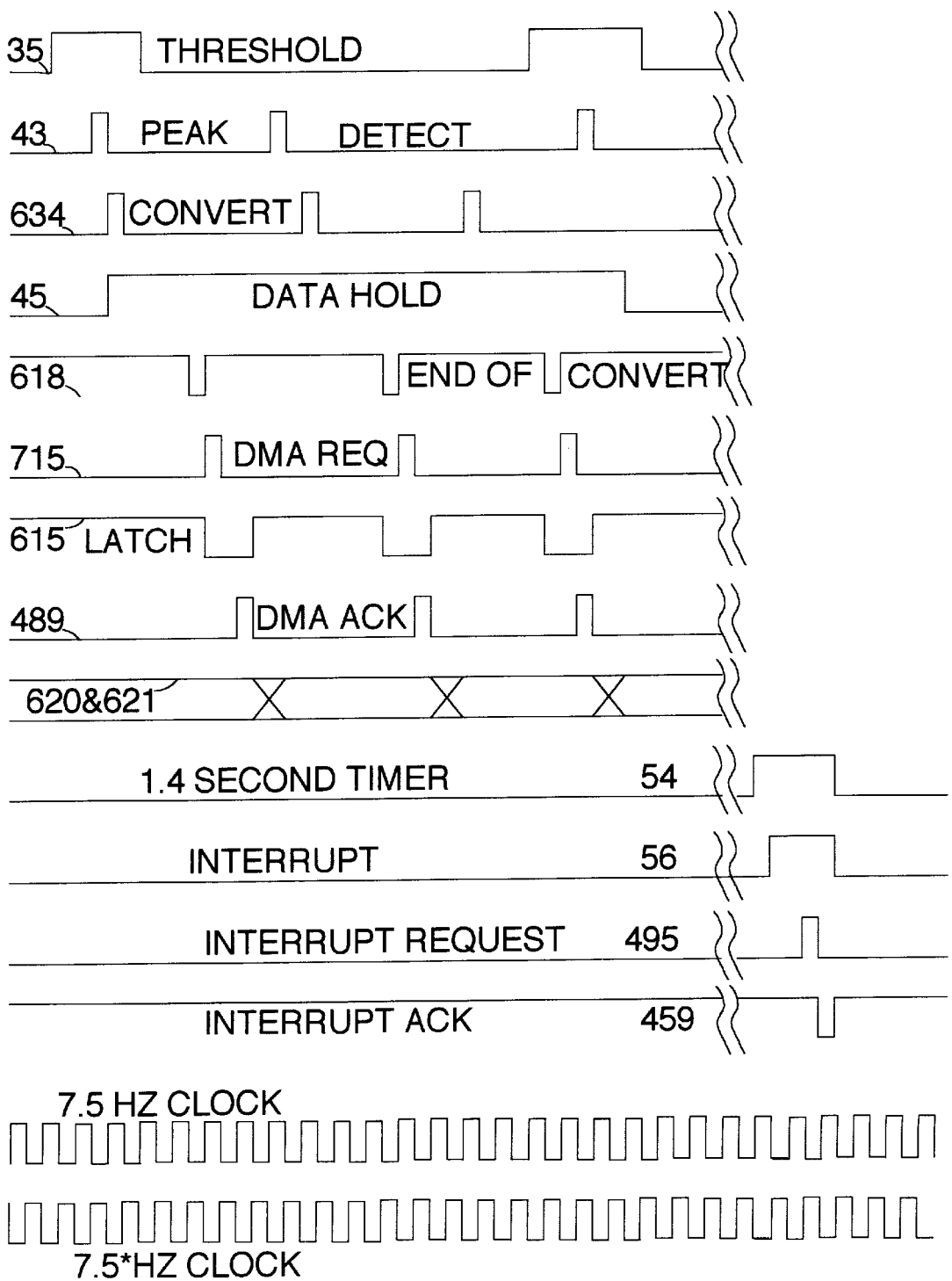

Description of FIGS. 4 to 5

The recognition circuitry, as shown in FIG. 4, takes advantage of the aforementioned characteristics to cooperate with the peak detector 36 and interrupt controller 38 to furnish control signals via lines 43 and 54 for high frequency sampling of the E and H field voltages. As shown in FIG. 4, the vertical electric field voltage E transmitted from integrator 26 via line 27 (see FIG. 3) and then lines 425 and 428 through DC blocking capacitors C28 to the slope detector 30. Slope detector 30 comprises two parallel similar circuits designated generally 430 and 437. U17 is an operational amplifier with TTL output; and, in the preferred embodiment, is a Signetics Model No. SE529 with two inputs, 435 and 436. Input 435 is connected to input 436 through a resistor R36 and input 436 is connected to ground through a capacitor C29. Operational amplifier U17 will provide a negative output voltage to NAND gate 446 whenever the field voltage E increases faster than capacitor C29 can charge through resistor R36. The product of resistor R36 and capacitor C29 determines the sensitivity of the slope detector 30. In the preferred embodiment, this product is set to be equivalent to a lightning signal change of 40 volts per microsecond and thus allows only the submicrosecond lightning pulses to be detected. Input 436 is a positive voltage bias through resistor R38 and the ratio of resistors R36 and R38 sets the minimum signal level which the slope detector 30 will detect. The preferred embodiment is set at 15 millivolts, corresponding to a lightning range of 200 NM. Similarly, circuitry 432 comprises operational amplifier U18 (preferably Signetics Model No. SE529) which provides a negative output to NAND gate 446 whenever field voltage E decreases faster than capacitor C32 can charge through resistor R40. Either a positive or negative voltage change of E having the correct rise time as functionally defined by circuitry 430 and 432 will provide a negative input to NAND gate 446. If no fast rise time occurs, the outputs of operational amplifiers U17 and U18 will be high.

Referring to FIG. 5, a curve, generally designated 500, which represents the vertical electric field Ev signal output from integrator 26. The ordinate in each curve represents voltage amplitude in millivolts and the abscissa represents time in microseconds. Inspection of the curve shows that the E field voltages associated with a single lightning flash (many strokes comprise a lightning flash) usually lasts approximately 0.5 second. The lightning flash is usually composed of a preliminary breakdown (see area 502 on curve 500), stepped leaders (see area 504 on curve 500), return stroke (see area 506 on curve 500), continuing currents (see area 508 on curve 500), and enter-stroke intervals (see area 510 on curve 500). Research in the nature of electrical signals arising from lightning strokes indicates that almost all vertical electric field voltages for the return stroke will have an initial rise time (see area 507 on curve 500) of less than five microseconds. The flash will contain a plurality of randomly placed smaller pulses or peaks of submicrosecond duration and rise times of less than five microseconds. See for example positive slopes 509, 511, 512 and 514 on curve 500. Examples of submicrosecond pulses, which will trigger the above described circuitry, is shown as slopes 507, 509, 511, 512 and 514 in FIG. 5. When the slope of the proper rise time (either positive or negative) occurs on the Ev voltage pulse 500, one of the operational amplifiers U17 or U18 will go low. Causing the output of NAND gate 446 to go high until the peak voltage on the pulse on curve 500 is reached and then the output of NAND gate 446 will go low. For example see FIG. 5, curve 516, where the output of NAND gate 446 is shown as the series of pulses 518 corresponding to fast rise times on the E signal 500.

Figure 6:
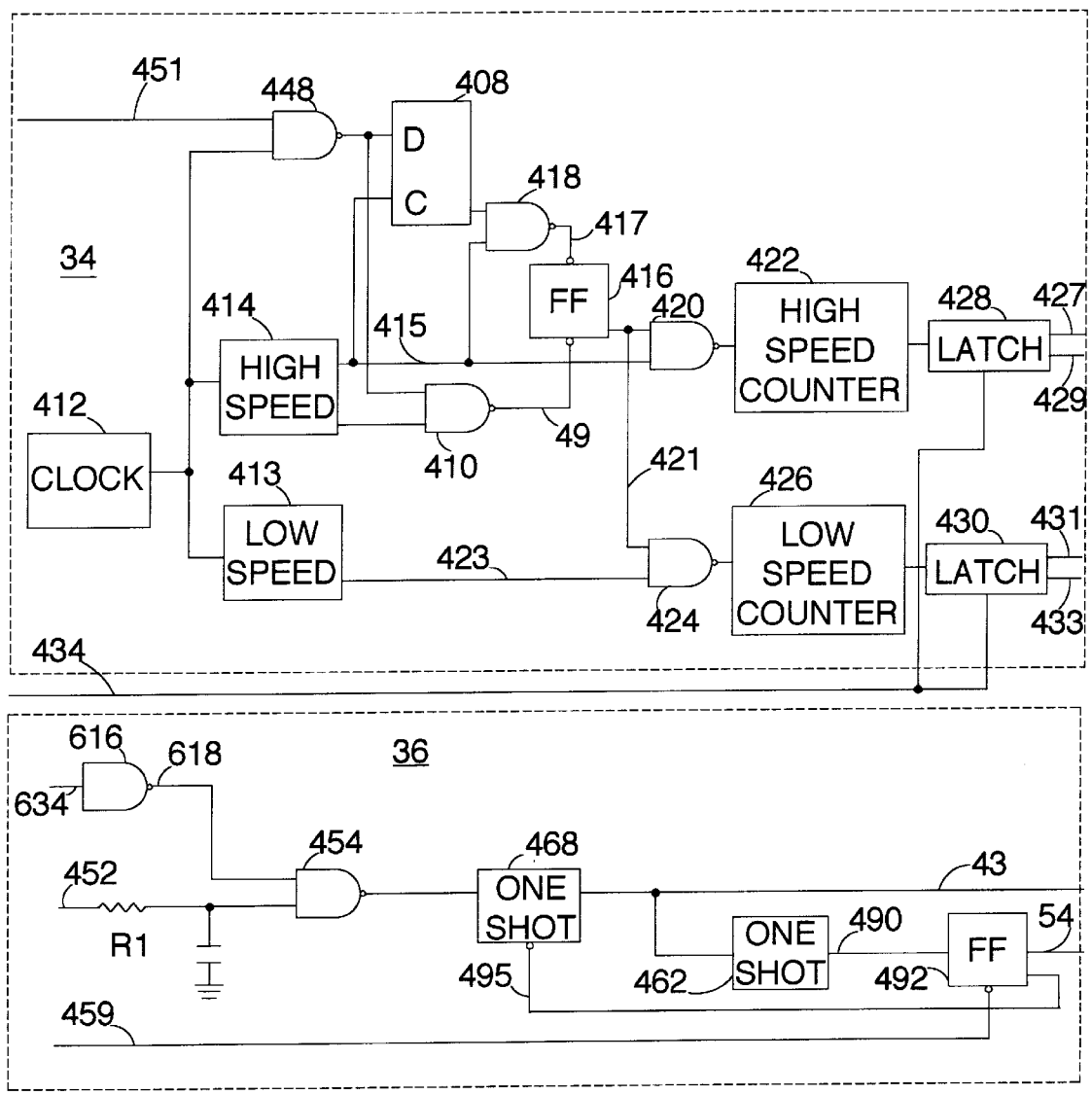
FIGS. 6 and 6A are schematic diagrams of the peak detector, pulse width monitor, electric and magnetic field sampling portion of the apparatus of the present invention.

Description of FIG. 6

The pulse width 34 and peak detector 36 are shown in FIG. 6. The output of NAND gate 446 (FIG. 4) is transmitted through R1 to NAND gate 454. Threshold detection NAND gate 448 transmits a high to the flip-flop 408 and NAND gate 410 via line 451. Flip-flop 408 input from line 451 is clocked to NAND gate 418 on the rising edge of the clock signal via line 415. The clock signal provided by the high-speed clock 414 is generated in the preferred embodiment by a 74L5393 counter. The high-speed clock signal provided by line 415 is preferably equal to two megahertz. The high signal provided by NAND gate 448 is transmitted to flip-flop 408 output on clock 415 rising edge and is provided as a low to the set input of flip-flop 416 via line 417. A low signal via line 417 causes the flip-flop 416 output to be high. A high signal on line 421 enables the NAND gates 420 and 424. The low speed clock 416 has as input the master clock signal via line 411. A 74L5399 is used to divide the master clock to 250 kilohertz. The low speed clock signal is provided to low speed counter 426 via line 423 and NAND gate 424 when enabled by a high on line 421. Likewise, the output of high-speed clock 414 is provided via NAND gate 420 to high-speed counter 422 when enabled by the high signal on line 421. Outputs of the low speed counter 426 and high-speed counter 422 are provided to lines 427, 429, 431 and 433 via latches 428 and 430. Output lines 427, 429, 431 and 433 are changed at each peak detect signal provided over line 43 which represents the time which the peak of the pulse occurred since the signal was above a minimum threshold. As the data ready signal provided by line 618 goes from high to low, the end of convert circuit 434 provides a high reset pulse to latches 428 and 430. In the preferred embodiment, latches 430 and 428 are 74L5 197. Also in the preferred embodiment, the high speed counter 422 and low speed counter 426 are 74L5393.

Whenever slope detection circuitry 30 causes a low going high signal at the input to one shot 432 (this output goes high when the fast rise time pulse from integrator 26 peaks, see FIG. 5). One shot 468 generates a 250-nanosecond pulse on line 43. The falling edge of the pulse causes interrupt controller 38 to sample the nose magnetic, wing magnetic, electric peak signals and the rise time to peak of the electric signal. This 250 nanosecond high signal on line 43 is one of the control signals generated by peak detector 36 and is called the peak detection signal. The peak detection signals are shown on curve 518 of FIG. 5. Note that they occur on the leading edge of the high going signal from NAND gate 454.

The output of one shot 468 is connected to one shot 462. The Q output of one shot 462 is connected via line 490 to flip-flop 492. When the 1.4 second interval is over and the Q output of one shot 462 goes high, it sets flip-flop 492 causing a high signal to be transmitted via line 54 to the interrupt controller 38. Interrupt controller 38 in response to control sign 54 provides INT0 via line 56 to data processor circuit 52 as an interrupt signal (see FIG. 3A). At the same time, flip-flop 492 Q goes low and is transmitted via line 495 as an inhibit data measurement signal to one shot 468. The low signal disables one shot 468 while the data processor circuit 52 interrogates memory 708 for the sampled E, H field voltages and rise time data . When the data processor circuit 52 has finished interrogating memory 708, controller 38 via line 459 transmits a clear signal to flip-flop 492 via line 487 which results in enabling 468 and disabling the high interrupt signal 54 to the interrupt controller 38 from flip-flop 492.

Figure 6A:
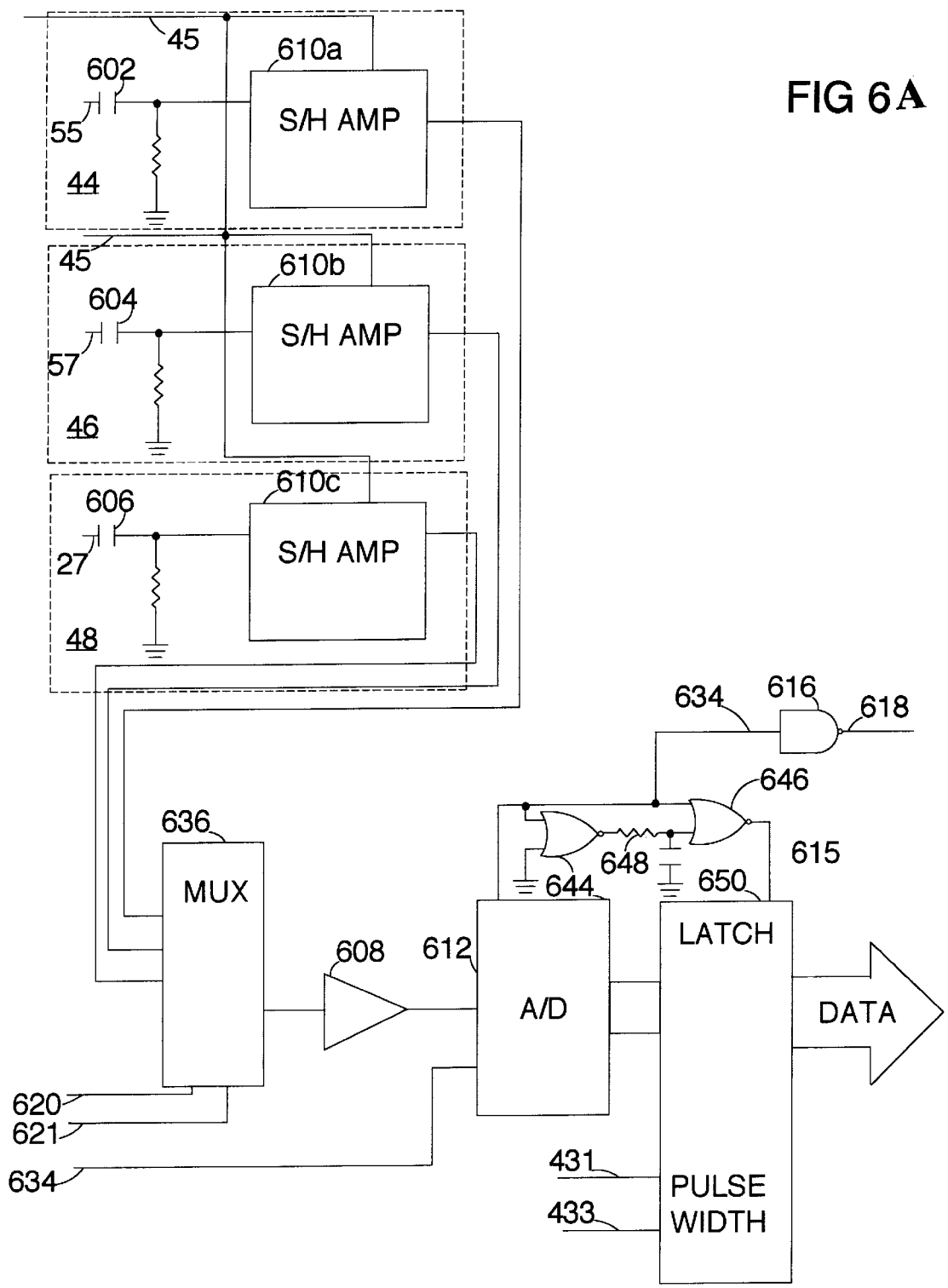

Description of FIG. 6A

FIG. 6A shows the high frequency sample/hold circuits 44, 46 and 48 of FIG. 3 in more detail. Capacitors 602, 604 and 606 block unwanted DC components from the signals E, Hnose and Hwing respectively furnished over lines 27, 55 and 57 but pass the high frequency signals. The high frequency signals are then transmitted to track and hold circuit 610a, b and c. Track and hold circuits (Analog Devices Model No. HTC-0300 MM in the preferred embodiment) in response to the peak detection control signals from one short 468 over line 45 (see FIGS. 3 and 6A) holds the peak field voltage constant. The voltage held by track and hold circuit 610a, b and C in response to the peak voltage occurring in the E voltage 500 (see the slopes 507, 509, 511 and 512 in FIG. 5).

Each peak field voltage signal held by track and hold circuits 610a, b and C is converted to a digital signal by analog to digital (A/D) converter 612 in response to the rising edge of the peak detection signal from line 43 and causes a high signal on lines 634. In the preferred embodiment, the A/D converter 612 is Datel-Intersil Devices, Model No. ADC817MM, which convert the analog signal into a twelve bit digital signal in 2.5 microseconds when the conversion is complete. A/D converter 612 then transmits a high signal over lines 634 and, on the falling edge, causes NOR gate 646 to output a low going high signal. This causes the digital sampled peak field voltage and the peak rise time data lines 15 (lines 431 and 433) to be clocked into the memory 708 where they are stored until called for by the data processor circuit 52. As described earlier, each peak signal on waveform 500 (Ev) in FIG. 5 has a rise time less than or equal to five microseconds causes a peak detection signal. Which then causes a sample of the E, Hnose and Hwing field signals to be taken and stored in memory 708 during the one millisecond interval (signal 517 in FIG. 5) generated by the Q output of one shot 468 in FIG. 5.

When the A/D converter generates a rising edge signals over lines 634 to NAND gate 616, NAND gate 616 transmits a low data ready signal over line 618 to NAND gate 454 (see FIG. 6). This disables one shot 468 from generating a new peak detection signal. If the data ready signal were not used to enable one shot 468, a second closely occurring peak voltage signal on waveform E would generate a second peak detection signal causing the A/D conversion process of the first sample signal to be interrupted. The high signal over line 634 causes the capacitor 650 to charge to a high signal via resistor 648 and NOR gate 644. On the falling edge of the signal on line 634, NOR gate 646 is enabled to generate a low signal over line 615 for a period of time determined by the product of resistor 648 and capacitor 650. The control signal on line 615 enables the transmission of the twelve bit AID digital signals to RAM 708.

Figure 7:
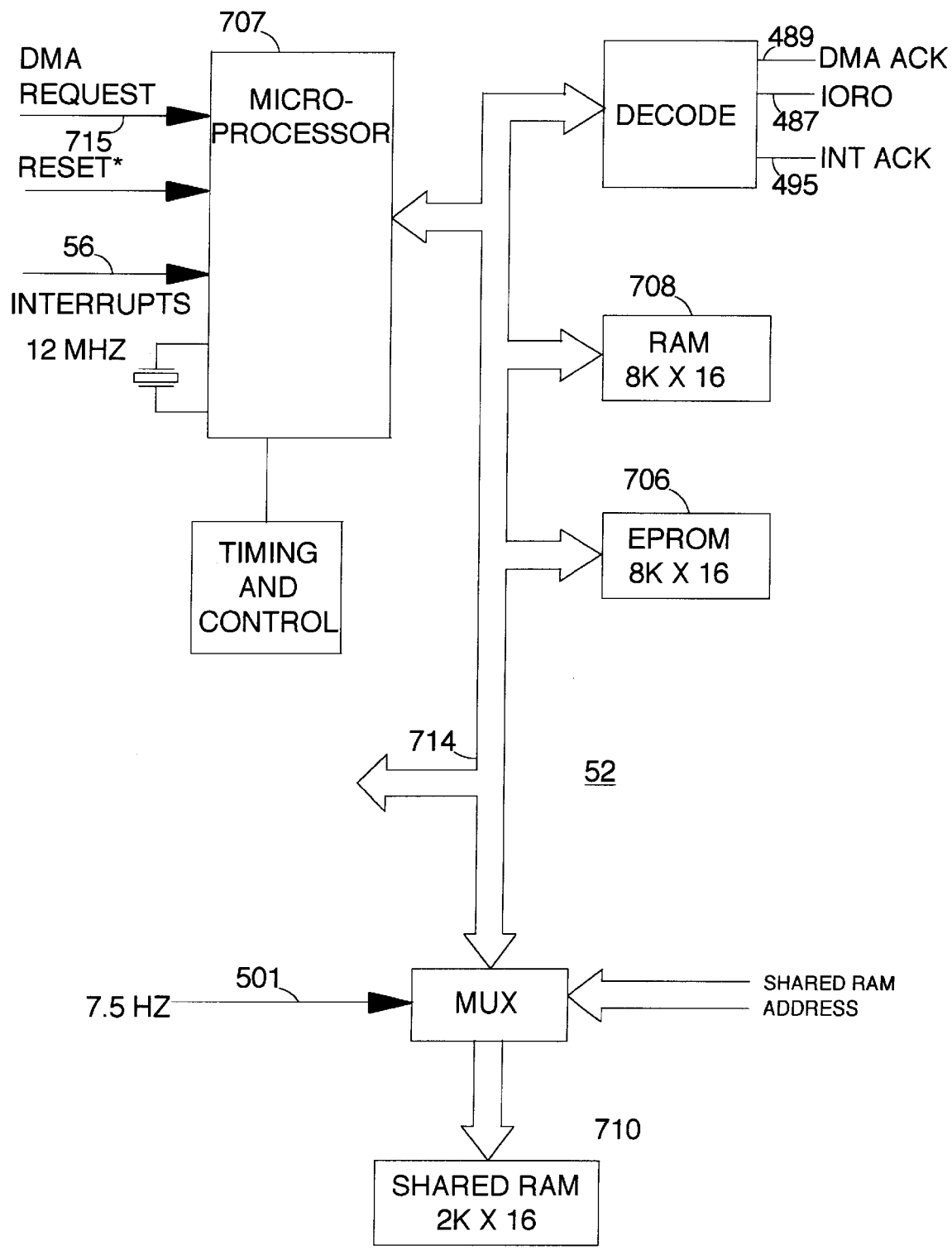
FIG. 7 is a functional block diagram of the data processor portion of the apparatus of the present invention.

Description of FIG. 7

Referring to FIG. 7, the system further comprises data processor circuitry means designated generally 52. The data Processor 52 is a control and data algorithm processor. This processor interfaces to the analog converter 4 and the I/O processor 80 via the shared RAM 710. All movement and mode control data comes from the I/O processor 80 via the shared RAM 710. Data processor 52 outputs all of its data (cell and control) to I/O processor 80 via the shared RAM 710. All data from the analog converter 4 is inputted to the data processor 52 via DMA channel zero using control signal 715. When the predetermined integration interval corresponding to the existence of the lightning stroke is ended, the interrupt controller 38 (see FIG.3A) transmits an interrupt control signal (INT0) via line 56 to the data processor means. The microprocessor 707 executes a program module INTERRUPT 0 (see FIG. 9) in response to interrupt INT0 which processes the data stored in RAM 708. This information is utilized in accordance with the programming of the data processor means 52 to calculate the location and level of activity of the lightning strokes. The processing circuit comprises a controller 707, random access memory (RAM) 708, read only memory (ROM) 706, and an address data bus 714. The various portions of the data processor circuit 52 are connected together by the address/data bus 714. The data processor circuit 52 is programmable, the programs being stored in ROM 706. After the data processor circuit 52 has finished processing data and is ready to receive new data from a new lightning strike, it transmits a data clear signal to flip-flop 492 (see FIG. 6) over line DMA ACK 489 via interrupt controller 38 and line 495 (see FIG. 3A). When a lightning strike is recognized by the recognition circuit shown in FIG. 7, a 1.4 second integration and sampling time is set by a low Q output of one shot 468 as described earlier. When this 1.4 second interval is over, the change in state of the output of one shot 462 sets flip-flop 492 providing an interrupt signal over line 54 to the interrupt controller 38. In response to control signal via line 54, interrupt controller 38 provides interrupt signal over line 56 to the microprocessor 707. The data processor circuit 52 is now ready to read the data via bus 714. The data to be read are the sampled fields E, Hnose, Hwing and peak rise time values stored in RAM 708. The sampled data program also stored in ROM 706 utilizes the sampled values of the lightning stroke to calculate the direction and to measure the range of the lightning activity. The direction is calculated in terms of an azimuth angle existing between the location of the lightning and the antennas 10, 12 and 14. As described earlier, each fast rise time pulse present in the lightning stroke triggers the circuitry (described earlier) to sample the E and H fields radiated by the lightning stroke. For each sample taken (where each sample corresponds to one pulse in the lightning stroke), three values E, Hnose and Hwing are measured by the three antenna elements. For one lightning stroke in the preferred embodiment, a maximum of 50 sets of three sampled field values are measured and stored during the 1.4 second.

Referring again to FIG. 7, the microprocessor 707 utilizes an Intel 80186 microprocessor with 16K bytes of RAM 708, 64K bytes of ROM 706, and 4K bytes of shared ("mailbox") RAM 710 with the I/O Processor 80. The hardware/software interface within the 80186 microprocessor consists of internal registers that control many of the timing and I/O ports used by the Data Processor 52. Due to the complexity of this interface, the Intel 80186 Microprocessor Programming Manual must be consulted for full details. This section will only summarize the major interface setups to be used.

The lightning signal data is transferred from the analog conversion hardware to RAM by the DMA channel zero. After signal processing the raw lightning data, the data processor 52 determines the lightning cells and tracks these cells by navigation inputs from the I/O processor 80. The cell data is transferred to the I/O processor 80 through the shared RAM 710. The microprocessor 707 is used in the fully nested interrupt mode with INT1 and INT3 not used. Table 1 lists the priority and device of each external interrupt source. The internal interrupts are listed in Table 2. All interrupt sources are serviced by an indirect call through an element of a vector table. This vector table is indexed by using the interrupt vector Type multiplied by four.

TABLE 1

| Type | Priority | Source | Description |
|---|---|---|---|
| 8 | — | Timer0 | not used |
| 18 | 2 | Timer1 | interrupt using |
| — | — | Timer 2 | timer2 |
| 12 | 1 | INT0 | 1.4 S Lightning buffer full |
| 13 | — | INT1 | not used |
| 14 | 0 | INT2 | 7.5 Hz mailbox interrupt |
| 15 | — | INT3 | not used |

TABLE 2

| TYPE | PRIORITY | INSTRUCTION | DESCRIPTION |
|---|---|---|---|
| 0 | 1 | DIV, IDIV | Divide error exception |
| 1 | 1 | All | Single step interrupt |
| 3 | 1 | INT | Breakpoint interrupt |
| 4 | 1 | INTO | INTO detected overflow |
| 5 | 1 | BOUND | Array bounds exception |
| 6 | 1 | undef op | Unused - opcode exception |
| 7 | 1 | ESC op | ESC opcode exception |

Shown in Table 1, the Data processor 52 has very few inputs and outputs. Digital data from the Antenna and Analog card is inputted via the DMA 0 channel. Controls and data to the Antenna and Analog card are via the digital data bus and PCS1. Communications with the I/O Processor are strictly controlled through a shared RAM 710 Data processor 52 from the outside interfaces. Discrete allows the software to determine the Data processor environment from the configuration straps/mode register and initializes the running configuration of the Data Processor accordingly.

The Data processor 52 software performs the lightning data collection, algorithm processing, cell stabilization in regards to aircraft movement, and formatting of the lightning cell data to the I/O Processor. The goal of this software is to provide processing of the lightning data only

TABLE 3

| MEMORY ADDRESS | INTERNAL REGISTER DESCRIPTION |
|---|---|
| 8020H, 803EH | Interrupt Controller Registers |
| 8050H, 8056H | Timer 0 Control Registers, spare |
| 8058H, 805EH | Timer 1 Control Registers |
| 8060H, 8066H | Timer 2 Control Registers |
| 80A0H, 80A8H | Chip Select Control Registers |
| 80C0H, 80CAH | DMA Channel 0 Control Registers |
| 80D0H, 80DAH | DMA Channel 1 Control Registers, spare |
| 80FEH, 80FFH | Relocation Register |

The results are transmitted via the I/O processor 80 to the display means 60, which then displays the results on a CRT display. The display means 62 comprises a CRT display. The data processor 52 and I/O processor 80 is enabled to compensate for movement of a host platform (such as a aircraft) when determining the region of lightning activity by monitoring, via multiple lines 732, aircraft heading direction which is provided by synchro to digital converter 740. The Data Processor 52 software program, due to the asynchronous occurrences of lightning, is interrupt driven. Table 1 shows the priority of interrupts with the type and rate of interrupt. First a description of the interrupts and then a discussion of the program functions. The DMA registers are used by the Data Processor 52 and must be setup to handle the hardware interfaces. DMA0 transfers words from the analog converter 4 on PCS-0 to RAM memory 708, therefore the DMA0 Control word (80CAH) is set to B267H. DMA1 is not used. The transfer counts and source/destination pointers are variables for the software subroutine to determine.

TABLE 4

| Antenna and Analog | |
|---|---|
| data: | E-Field High Frequency |
| | H-Field Nose High Frequency |
| | H-Field Wing High Frequency |
| Mailbox Data: | Status |
| | Mode |
| | Gain |
| | Heading |
| | Delta X/Y Position |
| | Calibration Data |
| | Checksum |
| Discrete Data: | Configuration Straps |
| | Mode Register |
| | Power Configuration |

Only the internal timers are used by the Data Processor 52. In the Timer Controller, Timer 0 is not used. The mode control register for Timer 0 (8052H) is set to 0400H with the Max Count A (8054H) and Max Count B (8056H) set to zero. This inhibits Timer 0 from producing an interrupt to the processor. Timer 1 mode control register (805EH) is set to E009H allowing Timer 2 as a pre-scalar and runs continuously. The Max Count A (805AH) is set to 0364H while the Max Count B (805CH) is zeroed. Mode Control register (8066H) for Timer 2 is set to C001H which inhibits an interrupt to the processor, runs off the processor internal clock and runs continuously. Max Count register (8062H) is set to 0364H, Timer 1 is pre-scaled by Timer 2 and both set to a value of 0364H, Timer 1 will interrupt the processor approximately every 0.5 seconds.

TABLE 5

| | |
|---|---|
| Antenna and Analog Data: | Control Strobes |
| Mailbox Data: | Status |
| | Fault Code |
| | Cell Data |
| | Nav Data |
| | Checksum |
| Discrete Data: | Mode Register |

The Data Processor only utilizes the internal interrupts. The Interrupt Controller registers set the priority of each of the interrupts. The Priority Mask register (802AH) is set to 0003H to allow INTR 2 the highest priority and its Control register (803CH) is set to 0012H. INTR 0 has second priority and its Control register (8038H) is set to 0013H. The Timer Control register (8034H) is set to 0001H, DMA 0 Control register (8034H) is set to 000DH to obtain the priority levels shown in Table 1. The INT3 and INT1 Control registers are not used. Also, the interrupts are level triggered and not cascaded or nested. EPROM 706 memory is the source of the program and constants. As shown in the memory map table, the EPROM responds to addresses FC000H to FFFFFH. This address space is 32K bytes. The static RAM 708 memory controlled by LCS is located at 00000H to 03FFFH and is intended to be the interrupt vectors, data RAM and stack for the microprocessor 707. The current design uses only 16K bytes of the 64K-byte block allocated. Future growth to 64K bytes is possible. The shared RAM 710 memory controlled by MCS-0 is located at 10000H to 13FFFH and is intended to be a "mailbox" for data transfers between the I/O processor and Data Processor 52. Hardware lockout is provided so that each processor has only a limited access period to the shared RAM 710. A 7.5 Hz (133 ms) interrupt on line 501 provides to each processor are phased such that the microprocessor has access for 87 milliseconds after the interrupt in which to complete its shared memory transactions. Then the I/O Processor 802 7.5 Hz interrupt allows 46 milliseconds after the interrupt for its transactions with the shared memory.

Figure 8:
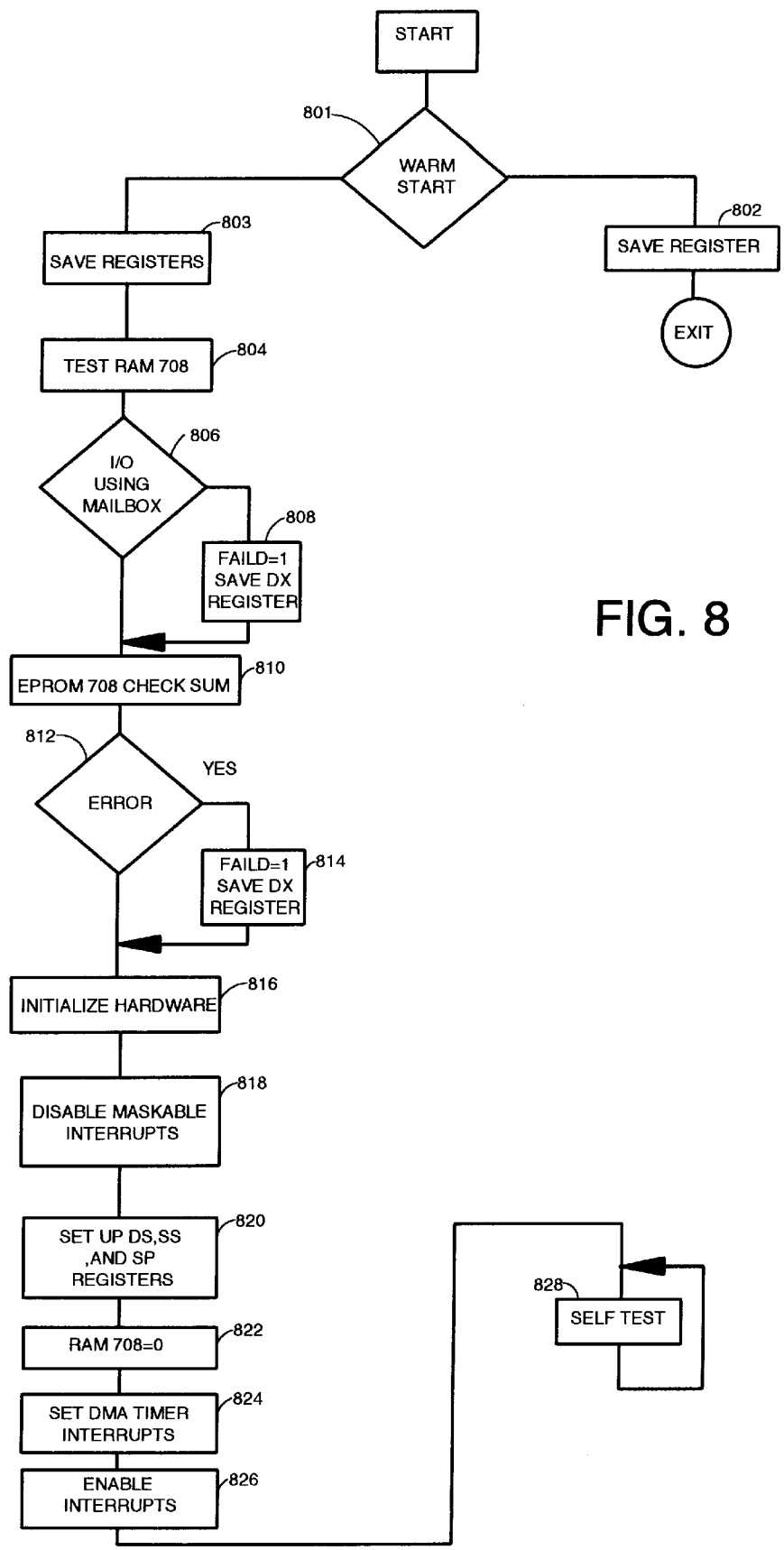
FIG. 8 is a software program flow chart suitable for programming the microprocessor in connection with initializing the apparatus of the present invention.

Description of FIG. 8

The data processor on power-up executes the program code in ROM 706 show in FIG. 8. Upon Power-up, the Data Processor configures itself. The Mode (configuration) register is read to determine the type of startup (cold or warm). The previous mode is used if a warm start is indicated. Then testing of the local RAM and EPROM occurs. Finally, initialization of the variables and the hardware is performed before starting a continuous background BITE test.

Program module START is represented in diagrammatic flow in FIG. 8. Module START first determines if a coldstart or warmstart is to be preformed in block 801. Warmstart condition causes the DX register values to be saved in their memory locations at block 802 and exit this routine. Block 803 saves the dx register, Next RAM 708 is tested(block 804) by using a pattern first of 5's and then of A's. If an error occurs then set the failed flag at block 808. Next calculate the EPROM 708 CHECKSUM and verify against the CHECKSUM stored in the EPROMS. If an error occurs then set the FAILED FLAG in block 814. Save the flags stored in the DX register in memory since the RAM has been powered.

Initialize the microprocessor 707 hardware options that control memory in block 816 so that the processor will run in the memory provided. This routine sets the proper values into the chip select control registers and the relocation register of the microprocessor 707. Upon reset, the microprocessor 707 uses 0FF00H in I/O as the base address of the internal control registers of the chip. The relocation register is set so that the control registers are memory mapped and at 8000H in unused memory. The memory chip select control registers have to be set up now so the microprocessor 707 can access the memory below the top 1K of memory.

The UMCS is not used in the SLDS box. The LMCS is set so the upper limit of the lower memory is 03FFFH (00H is the lower limit). There are no wait states programmed at this time. The MMCS is set so the base address of the mid-range memory is at 1000H with no wait states. The MPCS is set so that the mid-range memory has a block size of 64K with memory chip select size of 16K and 2 wait states. Bits 6 and 7 of the MPCS register are set to select all 7 PCS lines, A1 and A2 are not provided. The peripherals are memory mapped starting at address 22000H in block sizes of 128 bytes. See memory map below.

The control registers for the DMA controller, the INTERRUPT controller, and the TIMER controller need to be set up and will be done in block 816. Disables all maskable interrupts in block 818. The interrupts will be enabled at the end of module START. All the references to variables within a segment are memory mapped so that direct memory addressing can be utilized. This allows faster access than using I/O addressing. Also in order to reduce hardware for decoding address strobes the memory chip selects and the peripheral chip selects are memory mapped and used. Next sets up the DS, SS, and SP registers in block 820. First loads AX register with the address of the segment DATA. Then AX is moved into the DS and SS registers. The top of the stack, STACK_TOP (3000H) is loaded into the SP register.

Next zero the entire RAM in block 822 and load the control block registers. INITIAL first loads the interrupt vector addresses in RAM starting at 0000H. The control block registers for the DMA controller, the TIMER controller, and the INTERRUPT controller are then loaded with their proper values in block 824. Load the offset and base address of each interrupt into the RAM locations starting at 9999H. Interrupt type 0 through type 20 is loaded into RAM 708. INITIAL next sets up the control block registers for the microprocessor 707. In the control block are registers for controlling the on chip timers, DMA controller, and interrupt controller. Except for the initial processing done at power-up, all lightning data and associated data are processed as the result of handling an interrupt. The 133 ms interrupt comes in on pin INT2 to the processor and is handled by INTERRUPT 2. The 1.4-second interrupt comes in on pin INT0 to the processor 707 and is handled by TASKIN. The 0.5 second interrupt is generated by the on chip timers and is handled by TIMER 1. The divide overflow restarts the processor. Now the control registers in the microprocessor 707-control block for the DMA CHANNEL 0 controller, TIMER controller, and the INTERRUPT controller are loaded with the proper values.

In the DMA CHANNEL 0 controller, a count of 3F9H is loaded into the transfer count register. The source pointer is set to 22000H and is set so that it does not increment or decrement. The destination pointer is set to 3000H and increments as words are transferred. When 1.4 seconds has gone by, the DMA CHANNEL 0 controller will be set up by the 1.4 SECOND INTERUPT HANDLER with the destination pointer set to 3800H. The 1.4 SECOND INTERRUPT HANDLER will alternately use these two starting addresses. The control register of the DMA CHANNEL 0 is set so that the source address doesn't change. The destination address is incremented. Interrupts are disabled. DMA is terminate with the transfer count-reaching zero and the start/stop bit is reset at zero. Disable DMA requests from timer2, and both source and destination are memory mapped.

In the TIMER controller, TIMER0 is not used. The count registers, max count A register, and max count B register are all zeroed. The mode control register for TIMER0 is set to 400H to inhibit TIMER0 from producing an interrupt to the processor. TIMER1 has count register and max count B register zeroed. Max count A register is set to a value of 3792. TIMER1 mode control register is to enable an interrupt to the processor, using TIMER2 as a pre-scalar, and runs continuously. TIMER2 has the count register zeroed. The max count register is also set to a value of 3792. The mode control register is set to inhibit an interrupt to the processor, runs off the processor internal clock, and runs continuously. With TIMER1 pre-scaled by TIMER2 and both set to the value of 3792, TIMER1 will interrupt the processor approximately every 0.5 seconds.

Last, in the INTERRUPT controller, the controller registers set the priority of each of the interrupts. INT2 has the highest priority, TIMER has second, and INT0 has the third priority. INT1, DMA CHANNEL 0, and DMA CHANNEL 1 are all masked off. The interrupts are not nested or cascaded. They are all level triggered. The priority mask register is set to 3 to mask off any interrupts with a priority lower than INT0. The mask register is set to 2C to mask off any other interrupts besides TIMER, INT2, and INT0. Finally the type of start-up is determined and the proper variable initialization is performed. INITIAL now enables all maskable interrupts that were disabled in HWINIT.

Finally background processor test in an endless loop. All other processing is interrupt driven.

Figure 9:
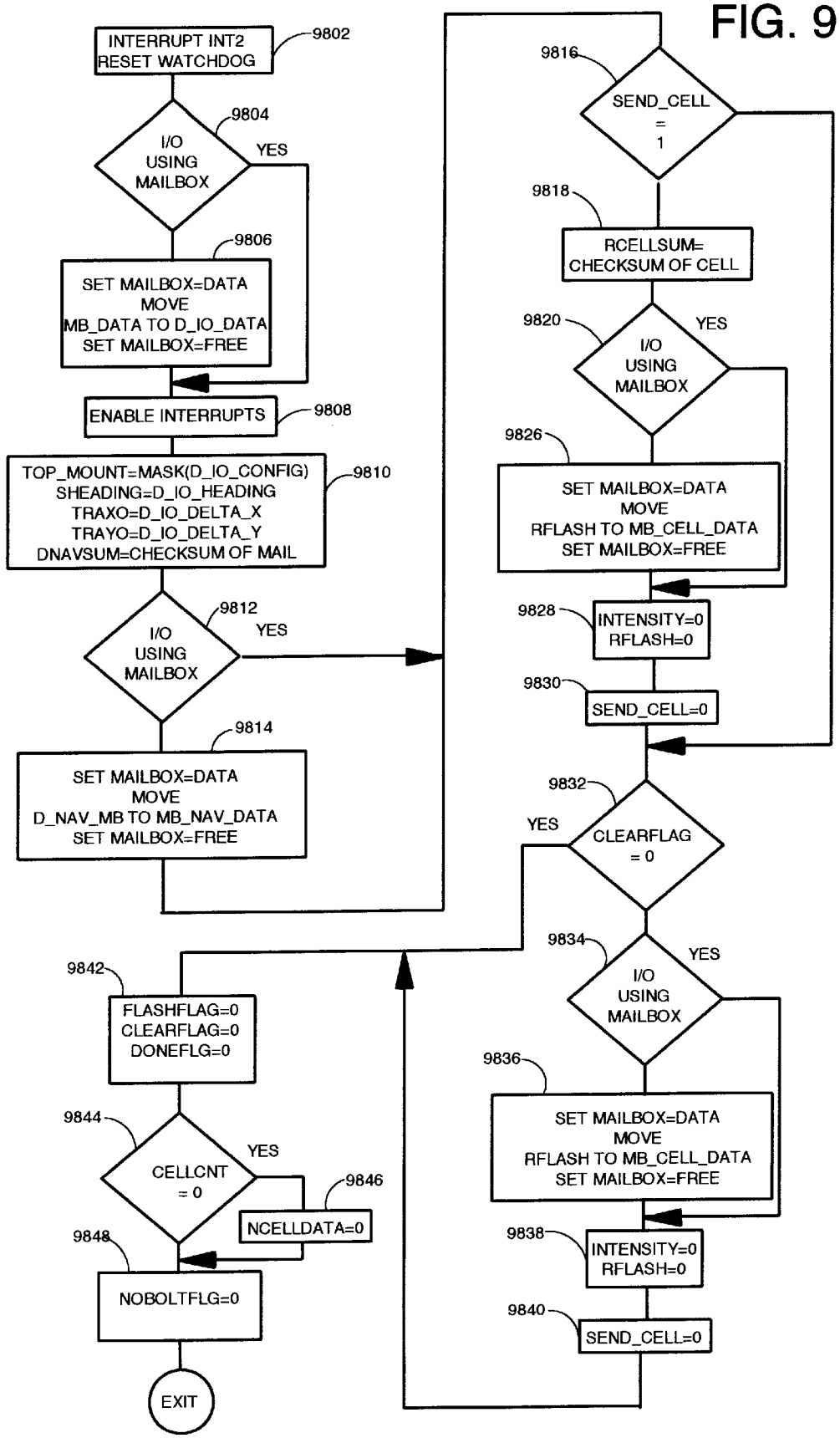
FIG. 9 is a software program flow chart suitable for programming the microprocessor to transfer data between data processor and I/O processor of the apparatus of the present invention.

Description of FIG. 9

The Data Processor is interrupt driven. This requires that the program module INTERRUPT1 complete its task before another program module INTERRUPT 0 occurs. The module INTERRUPT 2 is allowed to interrupt any other interrupt routine. This interrupt must be completed in 87 milliseconds, occur every 133 milliseconds. The overall pipeline delay of lightning data to output to the Mailbox has a goal of 2.8 seconds. Table 6 summarizes the software timing budgets for the Data Processor.

TABLE 6

| INTERRUPT | PERIOD | MODULE NAME | TIMING MAXIMUM |
| --- | --- | --- | --- |
| Real time clock | 133 ms | INTERRUPT 2 | 87 ms |
| Stroke buffer | 1.4 s | INTERRUPT 0 | 400 ms |
| Counter timer | 0.5 s | TIMER 1 | 450 ms |

The INTERRUPT 2 module reads and writes the Mailbox for communication with the I/O Processor 9802. The flow chart for INTERRUPT 2 is shown in FIG. 9. The Modes are processed to determine Normal or Test operation. Upon Power-up, the shared RAM is tested. This routine is responsible for saving the current mode of the system in the Configuration register. The Data Processor calls the module INTERRUPT 2 in response to interrupt 2. The purpose of this routine is to service the 133 MS hardware real time clock interrupt INT2 (WATCHDOG TIMER). Obtain the navigational and mode data from the I/O Processor. Transfer cell and NAV data to the I/O Processor. INTERRUPT 2 module sets up the mailbox (shared RAM 710) in the data processor 52. The I/O processor interfaces with the DATA Processor via the shared RAM called the Mailbox. Control over this shared space is accomplished by writing a 'mine/ yours' ownership to one of the variables. The Data Processor has access for the first 60 percent of the 133 ms real time clock interrupt. The I/O Processor has access during the remainder of the interrupt. If either CPU accesses the shared memory during the other CPU's time slot, an open bus read condition would occur. This module defines the organization of the Mailbox. A duplicate (duplicate by location and function, similar by name) copy is in the I/O CPU software.

Module INTERRUPT 2 gets the navigational inputs from the shared RAM 710 via the I/O Processor in block 9806. These navigational inputs are used to stabilize the cell data due to movement. Upon a clear occurring, the system will clear all the data from this processor. Module INTERRUPT 2 sends cell information to the shared ram area (mailbox) for the display processor to use if tests in block 9816 is true. Block 9826 moves the flash data of the 4 possible flashes and the cell data of the 50 possible cells to the shared ram (mailbox) for the I/O processor to use. Registers AX, BX, CX, SI, DI and ES are used. ES is saved, the rest are destroyed. The value of FRSIGN is loaded into MB_OWNER. This is the last word sent to the cell section of the mailbox, which lets the I/O Processor know that block 9826 is through sending cell data. Block 9818 then calculates the sum of all the words to be sent to the mailbox and subtracts this sum from 5555H. This is the check sum for the flash and cell data being sent to the mailbox. This value is stored in DCELLSUM. Now block 9820 checks to see if the I/O Processor is using the mailbox. Block 9820 compares the contents of MB_CELL_OWNER to IOSIGN. If they are equal, the I/O Processor is using the cell section of mailbox. Block 9828 zeros out the intensities of the present cell data to get ready for the next 50-cell update before it exits. It also zeros out all the flash data to get ready for the next 4 flash update. This lets the data processor continue with other processing, but this update is lost. If, when MB_CELL_OWNER is compared to IOSIGN, they are not equal, Block 9826 exchanges MB_CELL_OWNER and DASIGN. It then checks to see if it got IOSIGN back in the exchange. If block 9826 didn't get IOSIGN back, it performs a normal exit from this routine. If block 9826 gets IOGISN back in the exchange, it jumps to move the flash and cell data to the mailbox with a string move. First, the number of words to be transferred is loaded into the CX register. Then the address of the destination of the flash and cell section in the mailbox is loaded into the DI register. Next, the address of the flash and cell data to be sent is loaded into the SI register. The direction flag is cleared. Now, interrupt 2 performs a string move, sending the flash and cell data to the mailbox. After sending the flash and cell data to the mailbox, INTERRUPT 2 zeros out all the intensities in its memory (block 9828) in preparation for the next 50-cell update. INTERRUPT 2 also zeros out all the flash data to get ready for the next flash update. Each 50-cell update takes place when the 133 ms interrupt handler (INTERRUPT 2) calls BLOCK 9836. Each 4 flash update takes place when the 1.4-second interrupt handler (INTERRUPT 0) is called. INTERRUPT 2 sends data to mailbox after TIMER 1 has called BLOCK 1128, and when there is flash data to be sent to the mailbox.

Block 9832 test clear flag. Clear flag is set when display processor is reset. This module removes all the cell data from the cell buffer and resets the appropriate flags and pointers. Block 9836 module saves the registers that are to be used by this module on the stack. The cell buffer and the mailbox cell buffer must be inactivated. This will be done by zeroing the active bits and the intensity bits. Next the hardware at the antenna and the analog card must be initialized. In case we are in the middle of processing a Flash buffer the DEL_DMA_FLAG is set to delete this buffer. Next BLOCK 9836 clears all the flags and counters used for the BIT test. Finally BLOCK 9836 removes any new stroke data, send a clear screen to the data processor and then clear the flags for the cell data to the data processor and zero the cell count. BLOCK 9836 restores all the registers that were saved upon entering this routine.

If mailbox is free in block 9804, block 9806 sets the value of mailbox and loads into MAIL_BOX_OWNER. This is the last word sent to the NAV section of the mailbox, which lets the I/O Processor know that data processor is through sending NAV data. Block 9810 then calculates the sum of all the words to be sent to the mailbox and subtracts this sum from 5555H. This is the check sum for the NAV data being sent to the mailbox. This value is stored in DNAVSUM. Now block 9812 checks to see if the I/O Processor is using the mailbox. Block 9812 compares the contents of MAIL_BOX_OWNER to DSSIGN. If they are equal, the I/O Processor is using the NAV section of mailbox. If block 9812 jumps to the block 9816. This lets the DATA processor continue with other processing, but this update is lost. If, when MB_NAV_OWNER is compared to IOSIGN, they are not equal, block 9812 exchanges MB_NAV_OWNER and DASIGN. It then checks to see if it got IOSIGN back in the exchange. If block 9812 didn't get IOSIGN back, it performs a normal exit from this routine. If NAVTOMB gets IOSIGN back in the exchange, it jumps to move the navigation data to the mailbox with a string move block 9814. First, the number of words to be transferred is loaded into the CX register. Then the address of the destination of the navigation section in the mailbox is loaded into the DI register. Next, the address of the navigation data to be sent is loaded into the SI register. The direction flag is cleared. Now, block 9814 performs a string move, sending the navigation data to the mailbox.

INTERRUPT 2 module block 9806 sends navigation information to the shared RAM area (mailbox) for the DATA processor to use. Block 9806 moves navigation data from the shared RAM (mailbox) to the DATA processor RAM. Registers AX, BX, CX, SI, DI, and ES are used. ES is saved, the rest are destroyed. Now block 9804 checks to see if the I/O Processor is using the mailbox. Block 9804 compares the contents of MB_IO_OWNER to IOSIGN. If they are equal, the I/O Processor is using the cell section of mailbox and jump to block 9808. This lets the data processor continue with other processing, but this update is lost. If, when MB_IO_OWNER is compared to IOSIGN, they are not equal, block 9804 exchanges MB_IO_OWNER and DASIGN. It then checks to see if it got IOSIGN back in the exchange. If block 9804 didn't get IOSIGN back, jump to block 9808. If MBTONAV gets IOSIGN back in the exchange, it jumps to move the I/O data to the mailbox with a string move in block 9810. First, the number of words to be transferred is loaded into the CX register. Then the address of the destination of the I/O section in the DATA processor's memory is loaded into the DI register. Next, the address of the I/O data to be read is loaded into the SI register. The direction flag is cleared. Now, block 9810 performs a string move, sending the I/O data to the DATA processor's RAM memory. The value of FRSIGN is loaded into MB_IO_OWNER. This is the last word read from the I/O section of the mailbox, which lets the I/O Processor know that data processor is through reading data. Block 9810 then calculates the sum of all the words read from the mailbox and subtracts this sum from 5555H. This is then checked against the I/O checksum read from the mailbox (D_IO_CSUM).

This completes the description of the software modules used by the interrupt 2 level. The following provides the description of the interrupt 0 level software modules Description of FIG. 10

Figure 10:
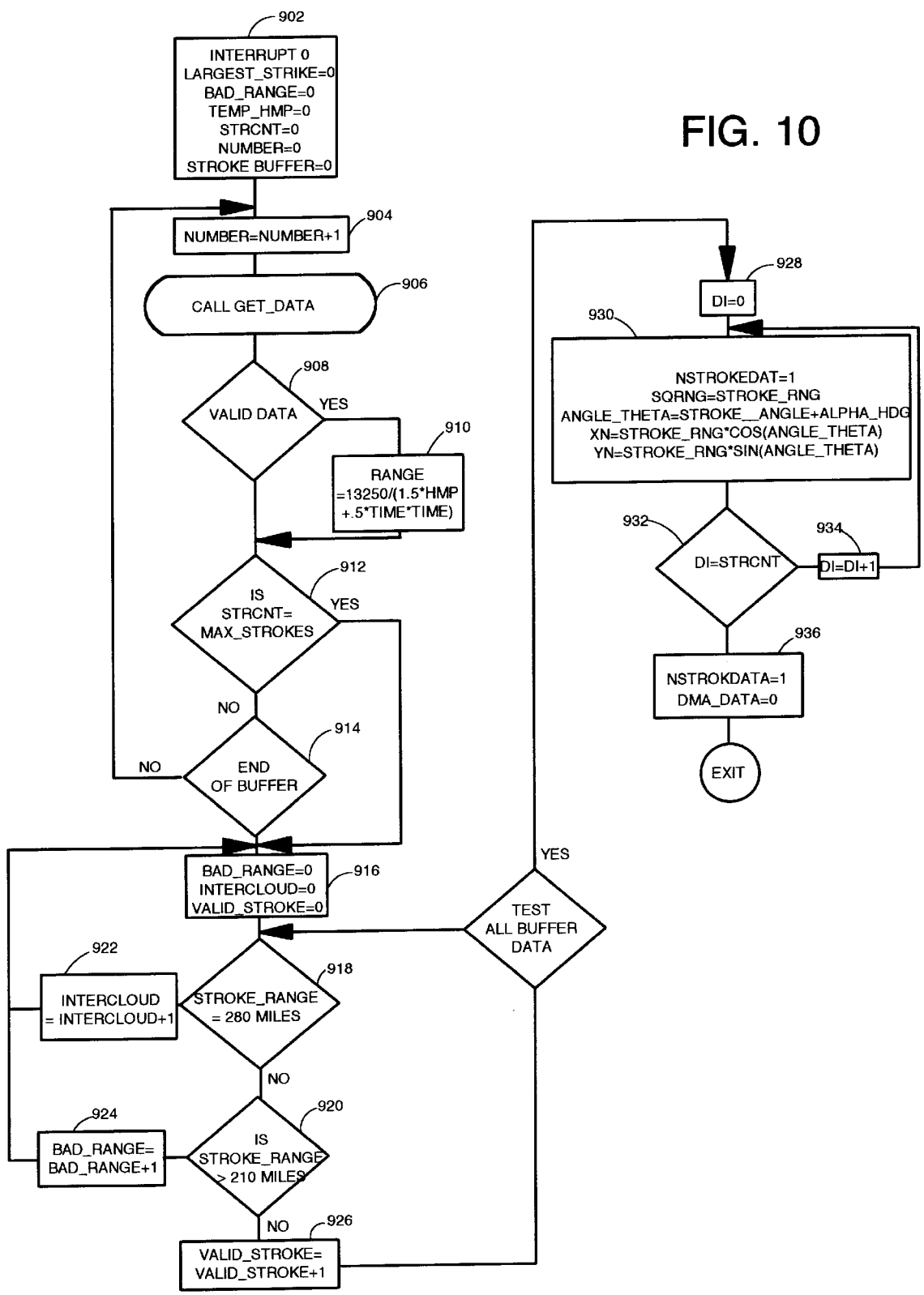
FIG. 10 is a software program flow chart suitable for programming the microprocessor to process the lightning signals into range and bearing information from the apparatus of the present invention.

Referring to FIG. 10, the data processor 707 executes the program code module INTERRUPT 0 in ROM 706 in response to interrupt signal INT0. The interrupt starts the processing of the lightning flash data and handles the coordination of filling and processing the raw data buffer. This module determines if the flash is valid and then computes the bearing and range. The final step is to compute the vector magnitude and the angle in relation to a Fixed Reference System (fixed point system). There are two factors affecting the processing of an interrupt.

1. Interrupt latency—the time it takes the CPU to finish the instruction it is executing before vectoring to the CPU interrupt handler.
2. Interrupt response—the time it takes the CPU interrupt handler to vector to the interrupt handler routine of the program.

INTERRUPT 0 routine is only be allowed to interrupt the monitor program. The longest instruction time in relation to interrupt latency is 16 CPU clock cycles. The interrupt response time is always 42 CPU clock cycles.

| | |
|---|---|
| Interrupt Latency | 16 |
| + Interrupt Response | 42 |
| | 58 CPU Cycles |

The total time that it will take from the occurrence of an interrupt 0 (INT0) is 58 CPU clock cycles (10 microseconds) until the start of the INTERRUPT 0 first code instruction execution. The Analog Converter 4 hardware monitors the Electric field intensity detected by the antenna. When a preset threshold and signal rise time occur the Electric field and 2 orthogonal Magnetic fields are sampled and held for DMA'ing to the processor memory 708. The three high frequency samples are stored immediately. This data is DMA'ed into the processors memory for a 1.4 second time period triggered by the first high frequency conversion. An interrupt is generated by the hardware to inform the software that a 1.4 second raw lightning data buffer is ready in memory to be processed. The raw lightning data buffer is always collected in relationship to the aircraft's present position.

INTERRUPT 0 module analyzes the lightning data stored in the raw data buffer. It ensures that the sequence of data storage has not been corrupted. The raw data buffer contains lightning data stored in 2.7 milliseconds over a 1.4-second time frame. It consists of several groups of high frequency magnetic and electric signals, along with pulse width information. A code is appended to each of the signals for identification. The H-NOSE, H-WING, AND E-FIELD high frequency signals are coded 0, 1, and 2 respectively. The high frequency signals are all scaled by 512/5, producing a binary point of 0. INTERRUPT 0 module process steps as follows:

1. Locates and processes the next valid high frequency group. If the next high frequency is not valid GET_DATA will continue to the next and the next until A valid high frequency is found (VALID_HI_FREQ=TRUE or End of this section is reached (END_OF_HF=TRUE or END_OF_BUF=TRUE) GET_DATA updates CUR_DATA_PTR.

2. Next store the highest high frequency magnetic and electric field values in the mailbox.
3. Load all error code values into display variables.
4. Clear the DMA buffer just used.
5. Compute RANGE Upon entering this routine a critical path follows which requires that all interrupts be disabled. INTERRUPT 0 processes this 1.4 second interrupt and determines in block 908 if the data contained in the raw lightning data buffer are valid lightning strokes, static discharges, dart leaders, or radio signal interference. INTERRUPT 0 computes the direction and approximate distance to the lightning stroke in block 930. INTERRUPT 0 may determine that a stroke has occurred but that not enough resolution was available to determine range. Therefore the data is called an inter-cloud stroke in block 922. INTERRUPT 0 module Identifies the DMA buffer just filled. INTERRUPT 0 sets up new DMA buffer and call processing routine in block 902. INTERRUPT 0 saves all registers and disables all interrupts for critical path processing. INTERRUPT 0 gets the calibration data and disables the DMA. INTERRUPT 0 then acknowledges interrupt to the Analog Converter. Next INTERRUPT 0 determines which buffer was filled and which buffer to fill next. INTERRUPT 0 completes the setup of the DMA values and enables DMA and interrupts. Now INTERRUPT 0 process data just collected in block 906. The each stroke in the raw data buffer is tested at block 908 and the range to the stroke is computed in block 910 if a valid stroke. If at end of raw buffer, blocks 916, 918 and 920 tests for valid stroke ranges. Block 930 computes the angle and fixed position of all valid strokes. Block 936 restores registers, sets DMA and NSTROKDATA flags and returns from interrupt.

Figure 11:
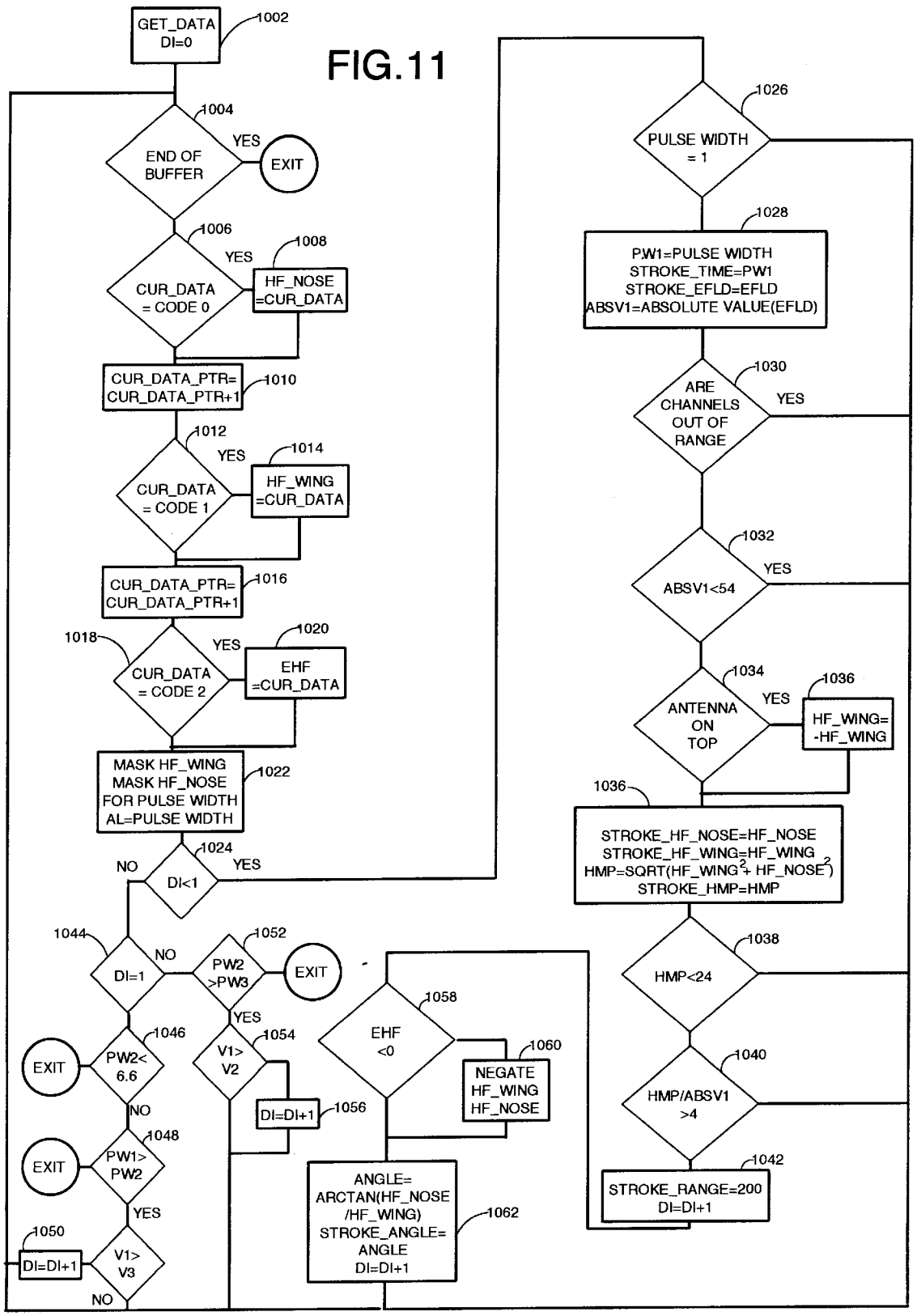
FIG. 11 is a software program flow chart suitable for programming the microprocessor in connection with processing the raw lightning data for the apparatus of the present invention.

Description of FIG. 11

GET_DATA graphical flow chart is shown in FIG. 11. The procedure locates the next high frequency lightning data stored in the raw data buffer by the hardware. It ensures that the sequence of data storage has not been corrupted, and filters out extraneous signals not removed by the hardware. The raw data buffer contains lightning data stored over a 1.4-second time frame. It consists of several groups of high frequency magnetic and electric signals, along with pulse width information. This high frequency data sequence may be repeated several times in each DMA buffer. A code is appended to each of the signals for identification. The H-NOSE, H-WING, and E-FIELD high frequency signals are coded 0, 1, and 2 respectively. The high frequency signals are all scaled by 512/5, producing a binary point of 0. Gain adjustments K1N, K1W and E1 are scaled by 16,384, resulting in a binary point of 14. The procedure first initializes the stroke count to record the number of valid strokes in the lightning flash in block 1002. The pulse count is initialized prior to each search for a valid stroke. A valid stroke is a waveform that can consist of one, two, or three pulses. A check (block 1004) is made to ensure that the procedure does not enter an infinite read loop and attempt to read data beyond the amount transferred into the raw data buffer. When a valid stroke is processed VALID_HI_FREQ is set to TRUE. The codes of the three high frequency words in a pulse are checked and the words are stored in blocks 1008, 1014 and 1020 for processing if the code sequence (0, 1, 2) is correct see blocks 1006, 1012 and 1018. If the words are out of sequence data corruption is assumed and that pulse is disregarded. After the three high frequency words in a pulse are stored, the pulse width is extracted from the high frequency H-NOSE and H-WING words in block 1022. The high nibble of the pulse width byte is in H-NOSE and the low nibble is in H-WING. The pulse width byte is coded with the LSB representing 0.333 microseconds. The pulse count is checked and the proper path selected depending upon which pulse it is. If it is the first pulse (block 1024) of a waveform the pulse width is required to be greater than 1.0 microseconds. If the pulse width is not within these limits (block 1026) the pulse is disregarded and the search for another pulse is started at block 1004. If the pulse width is within the limits the pulse width, high frequency H-NOSE, H-WING, and E-FIELD signals, and the absolute value of the high frequency E-FIELD signal are stored block 1028. The high frequency values are then adjusted by their corresponding computed gain constants. Block 1038 checks for values out of range. If out of range values, block 1038 discards pulse and restarts at block 1004. Next the E-field signal is check to verify above minimum threshold of 54 at block 1036. The high frequency signals are changed from offset binary to twos-complement form before storing. The antenna can be either bottom or top mounted on the Aircraft see block 1034. To reduce wiring errors the software inverts the H-Nose signals for bottom mounted antenna block 1036. Next the ratio of the magnetic vector to the electric field is checked to eliminate P-static and other non-lightning signals block 1040. If the ratio is invalid then disregard this pulse and the search for another pulse is started. If this ratio passes then the pulse count is incremented and an a stroke range at 200 nautical miles at block 1042. Next if E-field signal is greater than 0 at block 1058, the angle to strike is computed and pulses count incremented at 1062. If E-field is negative the magnetic fields are inverted at block 1036. If the pulse is the second pulse of a waveform, the pulse width is required to be greater than 6.6 microseconds at block 1046, indicating that it is part of the same waveform. If it is not, the data pointer is backed up three words so the pulse can be reconsidered as the first pulse of a new waveform and the current valid waveform is processed. If it is part of the same waveform, the pulse width is stored for later comparison. If the absolute values of the first and second pulse E-FIELD is greater than that of the second pulse (block 1048), the pulse count is incremented and the search for another pulse is started at block 1004. Otherwise, it is an invalid waveform and is disregarded and the search for the first pulse of another waveform is started block 1004. If the pulse is the third pulse of a waveform, the pulse width is required to be greater than the pulse width of the second pulse at block 1054, indicating that it is part of the same waveform. If it is not, the data pointer is backed up three words and the current valid waveform processed. If it is part of the same waveform, the absolute value of the first pulse high frequency E-FIELD is required to be greater than the third pulse high frequency E-FIELD at block 1054. If it is not, the waveform is invalid and the search for the first pulse of another waveform is started. If it is a valid waveform pulse count is incremented at 1056.

Referring again to FIG. 10, INTERRUPT 0 at block 930 computes the range. The range is calculated by using the following equation:

$$R = 13250/[1.5*HMP + 0.5*RISETIME*RISETIME]$$

INTERRUPT 0 next transforms the range and bearing to the stroke from the A/C to the fixed reference system. The angle theta in the fixed reference system is computed along with the distance x and y from the aircraft to the stroke in miles for summing by the module BLOCK 1106. INTERRUPT 0 transforms the angle and range to the stroke referenced from the A/C to the fixed system XN and YN distance and angle. First the loop counter SI is set to zero. DI is used as the offset when reading from STR_ANGLE and STR_RNG. SI is used as the offset when storing the computed values THETA, XN, YN and the RANGE SQUARED.

Compute the square of the RNG from the strokes to the aircraft. Store RNG * RNG in the variables HRNGSQ and LRNGSQ.

HRNGSQ:LRNGSQ=RNG*RNG

Compute the angle theta to the cell in the fixed reference system.

theta=STR_ANGLE+heading where;

STR_ANGLE is the angle to stroke from nose of A/C clockwise

STR_RNG is the range to flash from A/C;

And STRCNT is the number of valid return strokes in flash.

Next the module computes the sine and cosine of the angle theta to be able to compute the x and y distance in the fixed reference system. XN is computed by multiplying the range (RNG) by the cosine.

XN=RNG*COS

Store XN for processing in the module BLOCK 1106.

YN is computed by multiplying the range (RNG) by the sine.

;YN=RNG*SIN

Store YN for processing in the module BLOCK 1106.

SI is incremented by two and compared to STRCNT (stroke count). If SI is less, there are still more return strokes of the flash to transform and INTERRUPT 0 jumps back to transform the next return stroke. If SI is equal to or greater than STRCNT, there are no more return strokes to transform and INTERRUPT 0 is exited.

Figure 12:
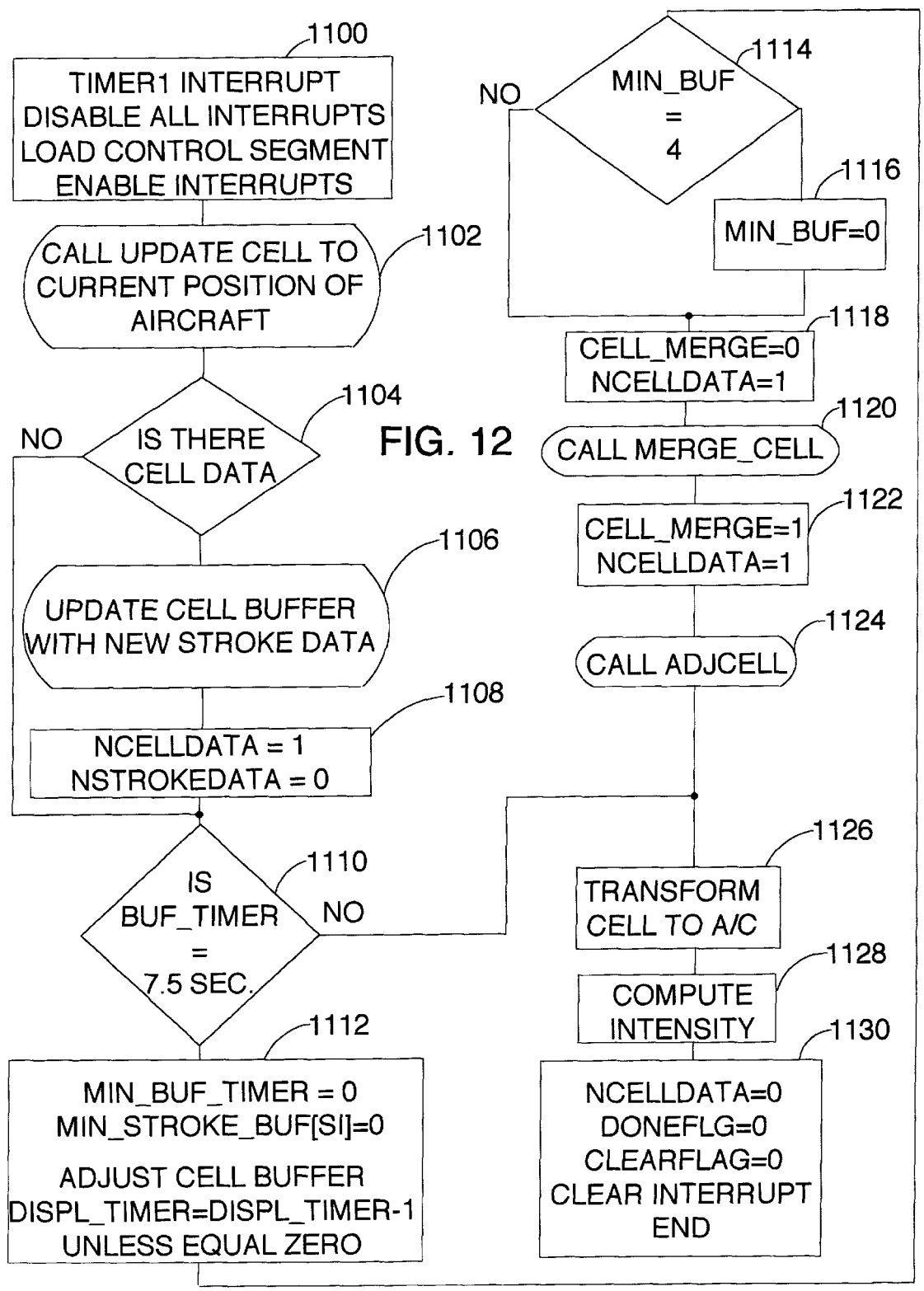
FIG. 12 is a software program flow chart suitable for programming the microprocessor in connection with grouping the lightning into cells and assigning intensity levels to display.

Description of FIG. 12

The TIMER1+2 clock, sets up by the data processor, interrupts the processor and calls software module TIMER 1. TIMER 1 is the interrupt handler for the TIMER 1 interrupt. The flow chart for module TIMER 1 is shown in FIG. 12. This interrupt handles the updating of the Cell Buffer to the new Aircraft Position. Adds new stroke data into the Cell Buffer. The TIMER 1 interrupt occurs every 500 milliseconds (0.5 sec) for the processing of the cell buffer to the I/O Processor and the updating of the cell buffer to the present aircraft position. Block 1102 updates cell buffer to present aircraft position by taking the distance traveled in the X and Y directions in the fixed reference system to update the cell buffer which was referenced to the old (previous) aircraft position to the new aircraft position. Upon new strike data being present (block 1104) the module BLOCK 1106 will execute. This module adds new data to the cell buffer in an averaging method to indicate severity of lightning activity. Block 1108 sets NCELLDATA flag and clears the no stroke flag. Block 1118 combines cells that overlap boundaries. The modules that are remaining process the cell buffer data for the I/O Processor. CHECK_STATUS module flags the cells that have activity of four or more strokes. Then FIX_COORDINATE module stores the vector magnitude and angle in relation to the fixed system activity for display. Finally Block 1130 computes the intensity of the cell from the number of strokes. This data is then ready to send to the I/O Processor. The module BLOCK 1124 determines when a four (4) minute activity period for a lightning cell has transpired. Upon finding such a condition the data for that lightning cell is halved.

TIMER 1 loads the ES register with the address of the CONTROL segment. Then interrupts are enabled. The routine Fixed Point to Aircraft (BLOCK 1102) is called to update the Fixed Point to the current aircraft position at block 1102. When new raw stroke data is present to be added to the cell buffer at block 1104, then TIMER 1 routine calls the cell buffer grouping program (CELLGRP) at block 1106. If less than or equal to 10 seconds, process raw data block 1126. Next clear flags (Block 1128) and exit. If Block 1110 is true, the minute buffer is set in Block 1112. Block 1114 selects one of four buffers to add new data. Block 1118 resets to first minute buffer. When one minute has transpired at block 1114 then change the one minute stroke buffer pointer to point to the next buffer. BLOCK 1106 sums the number of strokes that occurred during a one minute time period into its appropriate one minute stroke buffer for use by the BLOCK 1126 routine. Also zero the one-minute stroke buffer that is now to be used. There are only four one minute stroke buffers available and are used in a round robin fashion. Three have old data in them while the fourth one is now collecting new data. Then it increments CRTIME and compares it to 23. If it is less than or equal, CELLCNT is compared to zero. If CRTIME is greater than 23, it is set back to zero. Now call the BLOCK 1120 routine to determine if 2 or more cells should be merged. The CELLCNT is compared to zero. If CELLCNT is zero, BLOCK 1124 is not called because there are no cells to check-adjust for old data. If CELLCNT is greater than zero, then BLOCK 1124 is called to check the lightning cells for old data at block 1124. Block 1128 transforms the position of cell data to airplane coordinates. Then Block 1130 determines the intensity of each cell. The new raw data flag is set to indicate that cell data is to be processed to the I/O Processor. The different data flag types are used to create the data type for the I/O Processor to display. Next the cell buffer is processed into the format for the I/O Processor by calling BLOCK 1126. The ES register is restored and the Clear screen flag is cleared at block 1132. Finally the EOI register is set to 8000H to clear the TIMER 1 interrupt. The ES and other registers are restored and the interrupt handler exits. This completes the TIMER 1 interrupt.

Block 1102 module in FIG. 12 performs the updating to a fix position. The updating utilizes the coordinate axis translation method. The data is kept in a Fixed Reference System in order to eliminate accumulative data loss. After translation has occurred then the new vector magnitude and angle are computed. The new vector magnitude and angle is used for cell grouping and for the statistical averaging method to the display UPDATE_POSITION_DATA transforms the range, angle, ranges squared from the current cell buffer position to the aircraft's current position. It transforms the old cell info to be in relation to the aircraft's current position for adding new data. It also averages the angle and averages the range. BLOCK 1102 saves TRAXO and TRAYO in order to prevent these values from changing during transformation because this routine is the lowest on the interrupt priority. Then these values are zeroed to ensure that transformation does not happen twice for the same values.

Since the above is critical and nothing should interrupt until complete, the above is done with interrupts disabled.

The temporary values of TRAXO and TRAYO are checked for not being zero, which indicates a change between cell buffer and current aircraft position. When the value(s) are zero then this routine is exited. Else the following occurs.

The index into the cell buffer is initialized (SI=0). Next the cells are checked to see if they are active. If not active then SI is incremented and the next cell is tested. If SI=cellcnt then this routine has reached the end of the buffer and the program is exited.

If active the following calculations are preformed. This routine utilizes a fixed reference system to minimize the data loss that occurs through transformation. The fixed reference is the 0 degree heading reference from the I/O Processor. All angles are computed in a clockwise direction.

BLOCK 1102 saves the average range to the old cell locations for computing the range square sums.

A check is made to determine if this cell was/is at the origin (under the plane). If was then continue, If is then handle. Also check for the cells average range being greater than 375 nm, if so then remove cell. When the cell is greater than 375 nm the number becomes too large to hold in 16 bits.

The movement in the X direction is computed and summed into the sum of the X's as follows.

Sum of X's<=Sum of X's+[numstr*traxo]

This method of addition does not attribute any data loss to movement.

The movement in the Y direction is computed and summed into the sum of the Y's as follows.

Sum of Y's<=Sum of Y's+[numstr*trayo]

This method of addition does not attribute any data loss to movement.

Next we will compute the average X in order to determine the new average range and the angle theta.

average X<=sum of X's/numstr

Next we will compute the average Y in order to determine the new average range and the angle theta.

average Y<=sum of Y's/numstr

Check to see if we have moved to the origin yet. If so then go to the origin handling routine.

The new average range (RG) is computed by taking the square root of the sum of the squares of Ave. X and Ave Y.

RG=SQRT(X*X+Y*Y)

Now save the new average range value to be used to calculate the new sum of the Ranges squared. Check again for the average range being zero. Also check for the average range being greater than 375 nm, if so then remove cell. When the cell is greater than 375 nm the number becomes too large to hold in 16 bits.

The new angle theta must be calculated at this time. Using a lookup table of the Arc Tangent does this. This produces an average of the angle to the cell.

New theta<=Arctan table.

The sum of the ranges squared has to be translated as the above sum of the ranges was. In order to save time and simplify the math (square root problems) a special equation was utilized.

SUM RGSQ NEW<={SUM RGSQ OLD−[NUMSTR*RG OLD*RG OLD]}+[NUMSTR*RG NEW*RG NEW]

First the RG OLD was squared and then multiplied by the NUMSTR. Next this result was subtracted from the SUM RGSQ OLD. Then the RG NEW is squared and then multiplied by the NUMSTR. This result is then added to the SUM RGSQ OLD to produce the answer SUM RGSQ NEW.

At the bottom of the module is the code to handle cells passing through the origin. Set values to zero and check to see if this is the first time through. Upon first time through then the range squared term must be adjusted in order for the variance value of sigma to stay the same. Second time through then remove the flag and get out.

The module BLOCK 1106 (FIG. 12) processes the data from INTERRUPT 0 for grouping with lightning cells in the same area. This is accomplished by first determining if the lightning cell and the new stroke are within a defined radius of each other. When a match is found the new stroke is added to the existing lightning cell. The one-minute stroke buffer counter is updated. When a match is not found then the new stroke will create a new lightning cell. Intercloud strokes are handled differently. An Intercloud stroke will try to find a lightning cell with the same angle. Upon finding a lightning cell the Intercloud stroke will only update the activity time of the existing cell (remember that there is not enough information about this signal to calculate its range). Also a single Intercloud stroke for the above will be sent to the display at that angle. When an Intercloud stroke does not find a lightning cell in its same angle then a Intercloud stroke is sent to the display screen at the calculated angle of the Intercloud stroke.

The module BLOCK 1124 performs and adjustment of the number of strokes in a cell. This adjustment occurs when four minutes has transpired since the creation of this cell. The activity is halved. BLOCK 1128, BLOCK 1102, and BLOCK 1130 take the cell data that BLOCK 1106 has averaged and determines the minimum activity threshold. There are two values that determine the activity threshold. They are the last three minutes of activity and the cell activity count. BLOCK 1102 who sends the vector magnitude and angle to the cell Mailbox buffer then processes those cells above this threshold. The module BLOCK 1130 sets the intensity of the cell from the above stroke count.

TIMER 1 module calls BLOCK 1124 module. The cell buffer is searched for cells that are four minutes old. Cells containing old data that have two or more strokes are adjusted by reducing the number of strokes by one-half, adjusting the sum-of-X's and Y's (XSUM, YSUM), sum-of squares-of ranges (RGSQSUM), and incrementing the number of 4 minute inactivity cycles for the cell accordingly, and setting a new old data indication time (AJTIME). If the cell contained only one stroke it is flagged as inactive. A count of the number of inactive cells is maintained and checked against the cell count (CELLCNT) prior to exiting the procedure. If the cell buffer does not contain any active cells CELLCNT is reset to zero. The procedure first sets the index to the cell buffer (SI) and the inactive cell count (DI) to zero. If CELLCNT=0 the procedure is exited. Otherwise, the cell buffer is processed. The process starts by determining if the cell is active. If not active DI is incremented and the next cell obtained. If the cell is active the time to adjust the cell for old data (AJTIME) is compared with the current time the cell for old data (AJTIME) is compared with the current time (CRTIME). If they are equal the cell contains old data and must be adjusted. Otherwise, the next cell is obtained and processed. If a cell contains old data the number of strokes in the cell are checked. If the cell contains only one stroke the cell is set to inactive, DI is incremented, and the next cell obtained for processing. If the cell contains two or more strokes it is adjusted as follows.

AVE_X[SI]=XSUM[SI]/NUMSTR[SI]

AVE_Y[SI]=YSUM[SI]/NUMSTR[SI]

RGSQSUM[SI]=RGSQSUM[SI]/NUMSTR[SI]

NUMSTR[SI]=NUMSTR[SI]/2

XSUM[SI]=AVE_X[SI]*NUMSTR[SI]

YSUM[SI]=AVE_Y[SI]*NUMSTR[SI]

AVE_RANGE[SI]=SQRT{AVE_X[SI] 2+AVE_Y[SI]2}

RGSQSUM[SI]=RGSQSUM[SI]*NUMSTR[SI]

INACTIVITYCNT[SI]=INACTIVITYCNT[SI]+1 where XSUM=>HXNSUM:LXNSUM
YSUM=>HYNSUM:LYNSUM
RGSQSUM=>>HRGSQSUM:LRGSQSUM

The adjustment accounts for truncation due to integer math. The new raw data flag is set before exiting this routine to tell the TIMER 1 interrupt routine that new data exists to be processed to the display processor. The next cell is obtained for processing by incrementing SI to point to the next cell and comparing SI with CELLCNT. If SI<CELLCNT the next cell is processed. Otherwise, all cells have been checked and the number of inactive cells is compared with the cell count. If DI=CELLCNT the cell buffer does not contain any active cells CELLCNT is reset to zero and the procedure exited. Otherwise, the procedure is exited without changing CELLCNT.

TIMER 1 calls module BLOCK 1106. This procedure compare the lightning strokes processed by Block 1102 with the cells in the cell buffer. If the stroke is within a predefined radius of an existing cell it is added to that cell. Otherwise, it is added to the cell buffer as a new cell. Note! This routine has added to it code to reorder the cell buffer from smallest to largest using the AVE_RANGE values for selection. The location of the return strokes in the present aircraft position are used to update existing cells or generate new cells in the cell buffer. If a stroke is within the predefined radius of an existing cell in the cell buffer its data will be used to update that cell. If a stroke does not fall within the predefined radius of any existing cell its data is used to generate a new cell in the cell buffer. If a previous cell has become inactive the new cell will be stored in that location in the cell buffer. Otherwise, new cells will be added to the end of the cell buffer until it is full. Once the cell buffer is full, any new cells will be ignored. The maximum number of cells allowed in the cell buffer can be adjusted by setting MAXCELLS in the code segment. It is now at 50 in the preferred embodiment.

CKSTR, CELLCNT, and MAXCELLS are twice the number of strokes and cells respectively to allow for checking against the word addressing pointers SI and DI.

BLOCK 1106 procedure first obtains the stroke count (STRCNT), doubles it, and places it in CKSTR for use in checking the word pointer to the strokes for the end of data. The index to the table of strikes (BP) and (SI) is set to zero. Flags are zeroed and the Intercloud ranges and angles are preset to zero. The index to the cell buffer (DI) is set to zero before each stroke is compared to the cells in the cell buffer. Comparing DI with twice the number of cells (CELLCNT) starts the search for a cell, which the stroke matches. If DI is greater than or equal to CELLCNT the stroke did not match any of the active cells. Next a check is made to determine if this stroke was invalid. If yes, then throw away this stroke. If no, then a check is made to determine if this stroke was an Intercloud count. If yes, then stores the Intercloud angle, set range to zero, then increment the stroke pointer. If no, then check for the stroke being less than 200 NM. If not, then throw away this stroke and increment the stroke pointer. If yes, then the stroke is added as a new cell. Otherwise, the active flag for the cell is checked. If the cell is not active DI is incremented to point to the next cell and the search started again.

If range to stroke is 250 NM then this stroke is faulty and throws it away.

If range to stroke is 300 NM then process as an Intercloud.

If range to stroke is <=210 NM then use this stroke.

If the cell is active the difference in range between the stroke and cell is computed.

$$\text{diff} <= \text{square root}[(X_c-X_s)2+(Y_c-Y_s)2]$$

If DIFF is greater than the defined radius of a cell (CELLRAD) the stroke is not a member of the cell. Increment DI and continue the search. Otherwise, the stroke is a member of the cell and is added to it through the following equations.

XSUM[DI]=XSUM[DI]+X[SI]

YSIM[DI]=YSUM[DI]+Y[SI]

RGSQSUM[DI]=RGSQSUM[DI]+RG[SI]*RG[SI]

NUMSTR[DI]=NUMSTR[DI]+1

MIN_STROKE_BUF[DI][BX]=MIN_STROKE_BUF[DI][BX]+1

INACTIVITYCNTCNT[SI]=0

WHERE XSUM≧HXNSUM:LXNSUM

YSUM≧HYNSUM:LYNSUM

RGSQSUM≧SRGSQSUM:LRGSQSUM

Lightning alerts to the display:

The maximum range of the display is used to compute the range of the lightning alert (flash) sent to the display processor. Only a maximum of 2 lightning alerts is sent to the display processor at one time. Also these two (flashes) can not be within 7 degrees of each other to both be displayed. BLOCK 1106 adds new cells as follows:

If a stroke is to be added as a new cell, DI is first reset to zero and all cells checked to determine if an inactive cell exists in the cell buffer. The new cell is stored in the location of the first inactive cell encountered. If there are no inactive cells the number of cells is checked against the maximum allowed. If the cell buffer is full no more new cells are added. Otherwise, the stroke is added to the end of the current cells as a new cell. A new cell is added to the cell buffer with the following equations and the cell active flag set. Note that all four one minute stroke and one minute Intercloud buffers for this cell must be zeroed when creating this new cell.

XSUM=SXUM[DI]=X[SI]

YSUM[DI]=YSUM[DI]=Y[SI]

THETA_TN[DI]=ANGLE_THETA_TN[SI]

AVE_RANGE[DI]=

RGSQSUM[DI]=RG[SI]RG[SI]

INACTIVITYCNT[SI]=0

NUMSTR[DI]=1

AJTIME[DI]=CRTIME

MIN_STROKE_BUF[DI][BX]=1

ACTIVE[DI]=1

SI is incremented to point to the next stroke and compared with the stroke count. If SI<STRCNT, DI is reset to zero and the cells searched for a match to this next stroke. Otherwise, all of the strokes have been processed.

BLOCK 1106 computes new averages as follow:

The new ave_ranges must be computed. BLOCK 1106 gets the Ave. X's and Y's computes the square of the sum to obtain the average ranges. BLOCK 1106 only updates the cells that have had data added to them.

Ave. X Sxums[di]/numstr[di]

Ave. Y<=Ysums[di]

ave_range<=sqrt(x*x+y*y)

BLOCK 1106 next orders the cell buffer as follows:

This processing was required to allow interclouds to be added to the closest cell to the aircraft first. A decreasing loop test is used which tests fewer and fewer cells. The data items change place upon a closer value being found. The only time the buffer items change place is when a closer value is found. Therefore, this process should be very fast with little reordering taking place.

Next TIMER 1 calls module BLOCK 1120. This procedure compares the cells in the cell buffer to themselves in order to remove any overlap of two or more cells. If a cell is within predefined limits in range of an existing cell it is added to the first cell and then deleted from the buffer. Otherwise, it is left alone. CELLCNT is twice the number of cells to allow for checking against the word addressing pointers SI and DI. BLOCK 1118 finds an active cell and uses it for the first test cell. First the address pointers SI and DI are zeroed. Comparing DI with twice the number of cells (CELLCNT) starts the search for a cell, which is active. If DI is greater than or equal to CELLCNT there are no active cells and we exit this routine. Otherwise, the active flag for the cell is checked. If the cell is not active DI is incremented to point to the next cell and the search started again. If the cell is active then the address pointer (SI) for the test cell is initialized to DI. Comparing DI with twice the number of cells (CELLCNT) starts the search for a cell, which is active. If DI is greater than or equal to CELLCNT then we have reached the end of the cell buffer and are done for this pass. Otherwise, the active flag for the cell is checked. If the cell is not active DI is incremented to point to the next cell and the search started again. If the cell is active the difference in range between the cell and test cell is computed.

diff<=square root((Xc−Xt)2+(Yc−Yt)2)

If DIFF is greater than the defined radius of a cell (CELLRAD) the cells should not be merged. Increment DI and continue the search. Otherwise, the cells should be merged and are added together through the following equations.

XSUM[SI]=SXUM[DI]=XSUM[SI]

YSUM[SI]=YSUM[DI]=YSUM[SI]

RGSQSUM[SI]=RGSQSUM[DI]RGSQSUM[SI]

NUMSTR[SI]=NUMSTR[DI]+NUMSTR[SI]

MERGE_INDEX_ACTIVE[SI]=1

ACTIVE[DI]=0

AJTIME[SI]=This cells timer count

MIN_STROKE_BUF[SI]=MIN_STROKE_BUF[SI]+MIN_STROKE_BUF[DI](done for all four buffers)

WHERE XSUM≧HXNSUM:LXNSUM
YSUM≧HYNSUM:LYNSUM
RGSQSUM≧SRGSQSUM:LRGSQSUM

Check to see if DI is less that CELLCNT. If yes, then continue with search for merging of cells. If not, then increment the test cell address (SI). Check to see if SI is greater than or equal to CELLCNT to indicate merging has completed. If not, then increment the test cell address (SI). Check to see if SI is greater than or equal to CELLCNT to indicate merging has completed. If not, then check to see if this test cell is active. If not active then loop until an active test cell is found or we have reached the end of the buffer. If active, then make DI equal to SI so the searching of the cell buffer will only include those items, which have not been used as a search test item.

Now the new ave_ranges and theta_tn's must be computed. We must get the Ave. X's and Y's and compute the square of the sum to obtain the average ranges.

Ave. X<=Xsums[di]/numstr[di]

Ave. Y<=Ysums[di]/numstr[di]

ave_range<=sqrt(x*x+y*y)

theta_tn[di]<=arctan(Ave. X/Ave. Y)

Finally the value of CELLCNT must be verified. During merging the number of cells in the buffer may have been adjusted. The only cells that affect the CELLCNT are the last cells in the buffer.

TIMER 1 calls module BLOCK 1128. This procedure checks the lightning cells stored in the cell buffer for activity. Each cell is processed to determine the type of symbol the I/O processor will use to display. The preferred embodiment uses three levels (types of symbols on the display) to show the intensity of lightning signals. If an active cell is not above a certain threshold it is not processed for display. The lightning cells in the cell buffer are processed sequentially. CELLCNT is twice the number of cells currently in the cell buffer to allow checking for the end of the cell buffer with the word-addressing pointer SI. The procedure first sets the index to the cell buffer (SI to zero to point to the first cell. The process starts by checking the active flag of the cell. If the cell is active the number of strokes in the cell (NUMSTR) or the sum of the one-minute stroke buffers is checked against the threshold. If larger value is 1 the cell is processed for display. When a minimum of 1 stroke exists and the number of interclouds is greater than 2 then an intensity level one cell will be displayed. If the cell is inactive or the larger value contains less than two strokes and the number of interclouds is less than 3 it is not processed for display and the next cell is obtained for processing, as described later. Data from a cell is temporarily stored in a buffer, along with a cell identifies (CELLTAG), as follows:

T_THETA_TN=THETA_TN[SI]

AVE_RANGE=AVE+RANGE[SI]

THSQSUM=HSQSUM[SI]

TMSQSUM=MSQSUM[SI]

TLSQSUM=LSQSUM[SI]

TNUMSTR=NUMSTR[SI]

CELLTAG=SI

T_HEADING=SHEADING

T_INTEN_STR=Larger value(numstr[si] or sum of one minute stroke buffers) [1 stroke and 3 or more interclouds≧intensity level 1]

The BLOCK 1102 and BLOCK 1130 modules process the cell for output to the display processor. These modules are sequentially called by this procedure. The next cell is obtained for processing by incrementing SI to point to it and comparing SI with the cell count (CELLCNT). If SI<CELLCNT the next cells is processed. Otherwise, all cells have been checked and the procedure is exited.

BLOCK 1102 transforms the range and angle to a cell to the distance in R (rho) from the aircraft to the cell in miles and in the angle THETA from the fixed reference system (heading input). BLOCK 1102 takes the angle to a cell with the range to the cell and stores it for transmittal to the mailbox. Registers AX, BX, DX, DX and DI are used and destroyed. Where DI is the byte offset of the structure with RDISPLAYR and RDISPLAYTN being loaded with the values of ARG and THETA_TN. DI is determined by adding half of the value of CELLTAG to the value of CELLTAG. This corresponds to the word offset of the structure wanted. Then this value is shifted left one bit for the desired byte offset. This offset is stored in DCELLPTR for use in the module BLOCK 1130. The identifying of cells is necessary to let the display processor track the cells sent to it. ARG and TETA_TN are stored in RDISPLAYR and RDISPLAYTN in RCELL. RCELL contains 50 RDISPLAY structures. The structure RDISPLAY contains three words: RDISPLAYR, RDISPLAYTN, and RINTENSITY. RDISPLAYR and RDISPLAYTN are set in this module, while RINTENSITY is set in the module BLOCK 1130. RDISPLAYR is the first word, RDISPLAYTN is the second word, and RINTENSITY is the third word in each RDISPLAY structure.

RDISPLAY STRUCTURE: RDISPLAYR: WORD
RDISPLAYTN: WORD
RINTENSITY: WORD

The RDISPLAYR, RDISPLAYTN, and RINTENSITY values for each cell are stored in the same RDISPLAY structure number in RCELL as the number of the cell in the cell buffer that the values for THETA_TN and CELLTAG came from. ARG is stored at: RCELL[DI].RDISPLAYR THETA_TN is stored at:RCELL[DI].RDISPLAYTN Finally BLOCK 1130 module checks the number of strokes in the cell being processed by BLOCK 1128 and sets the intensity level. BLOCK 1130 checks the number of strokes in the cell being processed to determine the correct intensity code for the cell. BLOCK 1130 gets the value for HIGHINTEN and gets the value in T_INTEN_STR. HIGHINTEN is set to 3 for level 3 strike. The value for T_INTEN_STR is compared to the upper limit of middle intensity. The upper limit is 6 strikes, middle limit is greater than 3 and the lower limit is 1 strike. If the value for T_INTEN_STR is greater, the code for HIGHINTEN is stored in RCELL (DCELLPTR).RINTENSITY the procedure is exited. If the value for T_INTEN_STR is less than or equal to the upper limit of middle intensity, the value for HIGHINTEN is decrement to become the code for middle intensity (a value of 2). Now T_INTEN_STR is compared to the upper limit of low intensity. If T_INTEN_STR is greater, the code for middle intensity is stored in RINTENSITY and the procedure is exited. If T_INTEN_STR is less than or equal to the upper limit of low intensity, the code for middle intensity is decrement to become the code for low intensity and is stored in RINTENSITY. After storing the code for low intensity, the procedure is exited. T_INTEN_STR is not checked for being in the no display range of strokes because the module BLOCK 1128 does not process any cells for display with NUMSTR in that range. The RCELL pointer (DCELLPTR) was determined in the BLOCK 1102 module.

This completes the detail discussion of interrupt TIMER 1.

Figure 13:
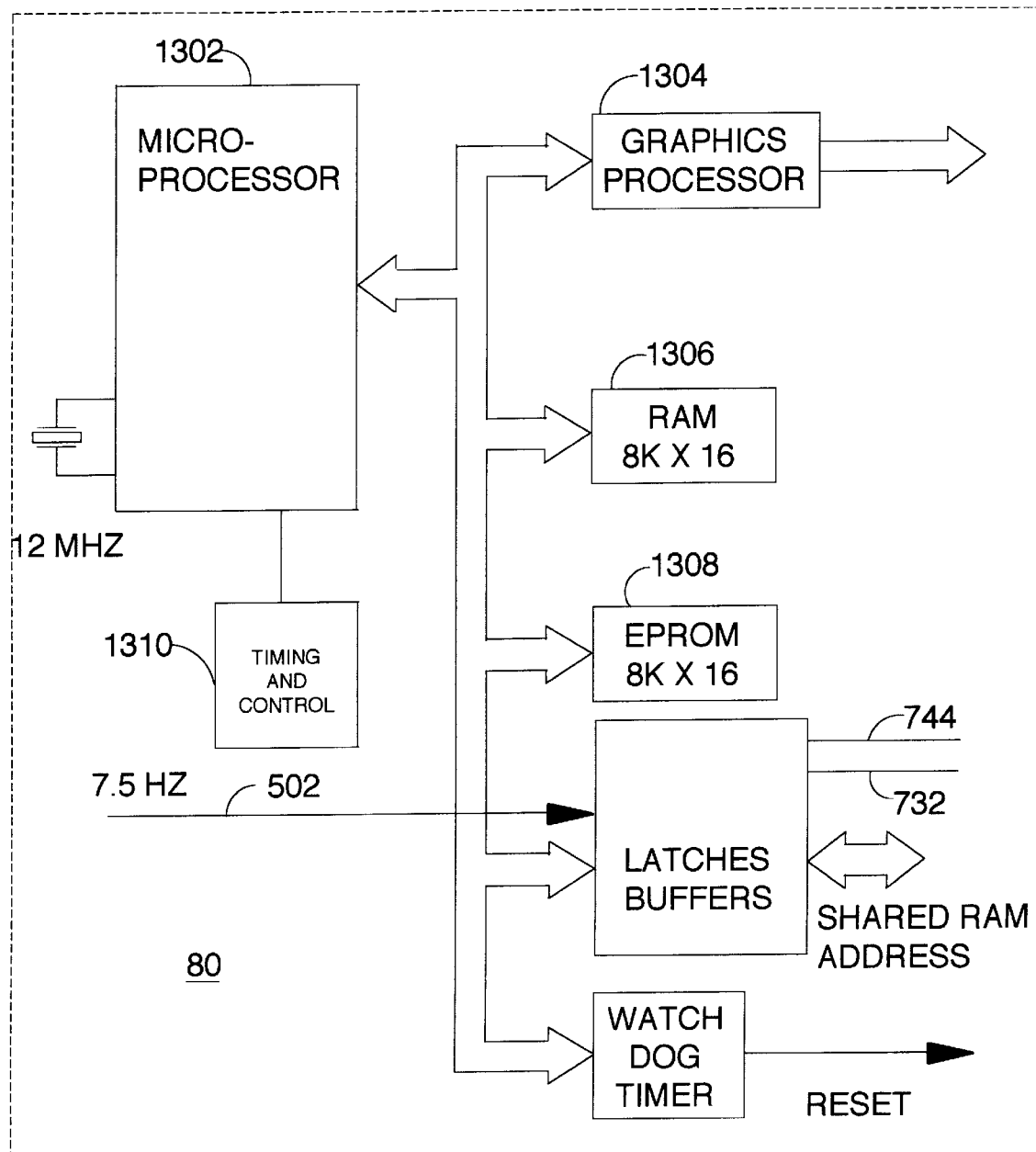
FIG. 13 is a functional block diagram of the data processor portion of the apparatus of the present invention.

Description of FIG. 13

The hardware/software interface within the microprocessor 802 shown in FIG. 13 consists of internal registers that control many of the timing and I/O ports used by I/O Processor 80. A microprocessor 1302 for the preferred embodiment is an Intel 80186. Due to the complexity of this interface, the Intel 80186 Microprocessor Programming Manual must be consulted for full details. This section will only summarize the major interface setups to be used. Table 7 and 8 summarizes the internal register map of the microprocessor 1302. The initialized values of each internal register are described in more detail below. The I/O processor 80 is a multi-interface display and control processor. A display output 60 (see FIG. 1) may be either 360-degree for lightning or 180/160/120/90-degree sector scans to accommodate a lightning display on an overlaid weather RADAR display. The I/O Processor 80 performs all of the interface conversions for the Data Processor in order to achieve maximum availability to not only new aircraft but also to aircraft retrofits. As shown in FIG. 13, the I/O Processor 80 utilizes an Intel 80186 microprocessor with 4K bytes of RAM 1306, 64K bytes of ROM 1308, and 4K bytes of shared ("mailbox") RAM 710 (see FIG. 7) with the Data Processor 52. An advanced CRT controller (ACRTC) 1304 with 64K bytes of video frame store RAM is attached to the 80186 bus for the purpose of generating the video output.

The I/O processor 80 EPROM 1308 is the source of program, constants, and interrupt vectors. To accomplish this, the hardware has OR'ed the LCS and UCS chip selects together. As shown in the memory map, the EPROM 1308 responds to addresses 00000H to 1FFFFH and E0000H to FFFFFH. These address spaces are 128K bytes each, while the EPROM 1308 is only 64K bytes. This results in 2 images of the EPROM 808 within each of the 2 address blocks. Future growth in program/constants is therefore possible by inserting new EPROM. The static RAM memory 1306 controlled by MCS-0 is located at 40000H to 4FFFFH and is intended to be the data RAM and stack for the microprocessor 1302. The current design uses only 4K bytes of the 64K-byte block allocated. This means that there are 16 images of the same RAM in the MCS-0 address block. Future growth to 64K bytes is possible. The shared RAM memory 710 locate in the data processor 52 controlled by MCS-1 is located at 50000H to 5FFFFH and is intended to be a "mailbox" for data transfers between the data processor 52 and the I/O processor 80. Hardware lockout is provided so that each processor has only a limited access period to the shared RAM. The 7.5 Hz (133 ms) interrupts provided via line 501 and 502 to each processor are phased such that the data processor 80 has access for 87 milliseconds after the interrupt in which to complete its shared memory transactions. Then the I/O processor's 7.5 Hz interrupt allows 46 milliseconds after the interrupt for its transactions with the shared memory The graphics processor 1304 is a Hitachi 63484 Advanced CRT Controller (ACRTC). Graphics processor is accessed on PCS-5 (3FE80H) for output to display 60. A full description of the 63484's capabilities is in the Hitachi User's Manual. The programming capabilities of the ACRTC are quite extensive, with over 50 internal registers and 38 commands. The controller is setup to draw 4-bit color displays that are 256×512 screen. All graphics in the operational display are drawn on the background displays. The Window display is reserved for the monitor/test software functions only. The Upper and Base backgrounds are used alternately so that the active display is updated by swapping background screens and drawing on the blanked background only. The Drawing parameter registers are initialized as shown, but note that these registers constantly change according to the particular drawing function being performed.

A 8259 Programmable Interrupt controller 1310 is accessed on PCS-1 (3FC80H) as the low byte and is initialized to be used as a single master in the microprocessor 1302 vector mode. Table 9 shows the 8259 initialization values. The initialization values are grouped since the 8259 assume automatic writes at 3FC82H will follow the lead command of the group. The interrupt controller 1310 is set up for IR0 as highest priority down to IR7 as lowest priority. The vector type is 48 (30H) as described in above.

TABLE 7

| I/O ADDRESS | INTERNAL REGISTER DESCRIPTION |
| --- | --- |
| 20H, 3EH | Interrupt Controller Registers |
| 50H, 56H | Timer 0 Control Registers |
| 58H, 5EH | Timer 1 Control Registers |
| 60H, 66H | Timer 2 Control Registers |
| A0H, A8H | Chip-Select Control Registers |
| C0H, CAH | DMA Channel 0 Control Registers |
| D0H, DAH | DMA Channel 1 Control Registers |
| FEH, FFH | Relocation Register |

The I/O Processor 80 software performs the avionics I/O interface functions, control of the Lightning Data processor, and the display formatting of the lightning cell data. Tracking and stabilization of lightning cells is accomplished through a variety of navigation interfaces that are handled in the I/O Processor. The goal of this software is to isolate the Lightning Data processor from the variety of aircraft interfaces, displays, and data protocols that occur when an avionics product is targeted for multi-aircraft, multi-vendor environment.

TABLE 8

| I/O ADDRESS | INITIALIZED VALUE | COMMENT |
| --- | --- | --- |
| 2AH | 0007H | Priority Mask |
| 2CH | 0000H | In-service |
| 32H | 0002H | Timer Control |
| 34H | 0004H | DMA0 Control |
| 36H | 0005H | DMA1 Control |
| 38H | 0067H | INT0 Control |
| 3AH | 0076H | INT1 Control |
| 52H | 0348H | Timer0 Max A |
| 54H | 0348H | Timer Max B |
| 56H | 4022H | Timer Mode Ctl |
| 5AH | 0034H* | Timer1 Max A |

TABLE 8-continued

| I/O ADDRESS | INITIALIZED VALUE | COMMENT |
| --- | --- | --- |
| 5CH | 0034H* | Timer1 Max B |
| 5EH | C023H | Timer1 Mode Ctl |
| A0H | E03CH | UMCS register |
| A2H | 1FFCH | LMCS register |
| A4H | 3FFCH | PACS register |
| A6H | 41FFH | MMCS register |
| A8H | A0FFH | MPCS register |
| C0H | FD88H | DMA0 Low Src |
| C2H | 0003H | DMA0 High Src |
| C4H | 0000H | DMA0 Low Dest |
| C6H | 0004H | DMA0 High Dest |
| C8H | 0020H | DMA0 Count |
| CAH | B366H | DMA0 Mode Ctl |
| D0H | 0000H | DMA1 Low Src |
| D2H | 0004H | DMA1 High Src |
| D4H | FD8AH | DMA1 Low Dest |
| D6H | 0003H | DMA1 High Dest |
| D8H | 0188H | DMA1 Count |
| DAH | 9786H | DMA1 Mode Ctl |
| FEH | 0000H | Relocation reg |

*Low speed ARINC transmission

TABLE 9

| ADDRESS | VALUE | DESCRIPTION |
| --- | --- | --- |
| 3FC80H | 13H | ICW1 lead, ICW4 req, single 8259, edge triggered |
| 3FC82H | 30H | ICW2, vector type 48 |
| 3FC82H | 01H | ICW4, 8086 mode, Normal EOI |
| 3FC82H | E0H | OCW1, intrpts enabled IR0–IR4 |
| 3FC80 | C3H | Rotated priority: IR4 highest, IR3 lowest |
| 3FC80H | 08H | OCW3, No Specl Mask, no poll |

As shown in FIG. 13, the I/O Processor 80 can have a diverse set of inputs and outputs. Interface lines 744, 732 are serial interfaces that provides a standardized means of communicating with many digital avionics systems and subsystems. The analog inputs provide a means of obtaining data from the aircraft systems that are not yet converted to digital serial busses. The video display outputs to a raster display format. Communications with the Lightning Data processor 52 is strictly controlled through a shared RAM 710 interface, thereby insuring a fast, flexible means of isolating the Data processor 52 from the outside interfaces.

I claim:

1. An apparatus for determining the location of lightning strokes, each lightning stroke generating electric (E) and magnetic (H) field components said apparatus comprising:

receiving means for receiving separately the electric (E) and magnetic (H) field components of a lightning stroke and for generating electrical signals associated with said E and H field components, said electrical signals being characterized by an initial rise time and a plurality of subsequent sub-pulse rise times;

means coupled to said receiving means for determining the direction to said lightning strike relative to said apparatus by operating upon said electrical signals associated with both said E and H field components; and;

means coupled to said receiving means for determining the distance to said lightning stroke from said apparatus by operating upon said E and H field components, said distance determining means comprising:

means for measuring, at a first frequency, a first magnitude of a received H field component of said lightning stroke; and means for measuring rise time to peak of a received E field component of said lightning stroke; and means for determining the distance to said lightning stroke as, an inverse function of both said first magnitude and rise time to peak of said E field component; wherein the functional relationship of the distance to said frequency and time to peak comprises:

R=13250/(1.5*H+0.5*RISETIME*RISETIME)

Wherein H is the magnitude of said first frequency, RISETIME is the time to peak of said first E field component and R is the range to the lightning flash.

2. The apparatus in accordance with claim 1 wherein said first frequency is substantially equal 50 kHz.

3. An apparatus for determining the location of lightning strokes, each lightning stroke generating electric (E) and magnetic (h) field components said apparatus comprising:

receiving means for receiving separately the electric (E) and magnetic (H) field components of a lightning stroke and for generating electrical signals associated with said E and H field components, said electrical signals being characterized by an initial rise time and a plurality of subsequent sub-pulse rise times;

means coupled to said receiving means for determining a direction to said lightning strike relative to said apparatus by operating upon said electrical signals associated with both said E and H field components; and;

means coupled to said receiving means for determining a distance and an intensity to said lightning stroke from said apparatus by operating upon said H field component, said distance and intensity determining means comprising:

means for measuring, at a first frequency, a first magnitude of a received H field component of said lightning stroke; and means for measuring rise time to peak of a received E field component of said lightning stroke; and means for determining said distance to said lightning stroke as functions of both said H field magnitude and rise time to peak of said E field component;

means for collecting a predetermined number of said H magnitude and said E field components into a cell group to determine said intensity of said lightning strokes; wherein said cell comprises:

SUM of X's=SUM of X's+(NUMSTR*TRAXO)

SUM of Y's=SUM of Y's+(NUMSTR*TRAYO)

RG=Square root $(X^2+y^2)$

Wherein SUM of X's is the sum of said lightning strokes alone said apparatus x axis, SUM of Y's is the sum of said lightning strokes along said apparatus y axis, NUMSTR is the number of said lightning signals, TRAXO is the movement of said apparatus along said x axis, TRAYO is the movement of said apparatus alone said y axis, and RG is a new distance from said apparatus.

4. An apparatus in accordance with claim 3 wherein said intensity of said lightning stroke is determined by counting said lightning strokes over said predetermined time.

5. An apparatus in accordance with claim 3 wherein said predetermine time is substantially four minutes.

6. An apparatus in accordance with claim 3 wherein said cell group comprises, DIF<=square root [(Xc-Xs)2+(Yc-Ys)2]

If DIFF is greater than the defined radius of a cell (CELLRAD) the stroke is not a member of the cell, Wherein Xc and Yc is the position of the cell group and Xs and Ys is the position of the said lightning.

* * * * *